(12) United States Patent
Grandusky et al.

(10) Patent No.: US 9,299,880 B2
(45) Date of Patent: Mar. 29, 2016

(54) PSEUDOMORPHIC ELECTRONIC AND OPTOELECTRONIC DEVICES HAVING PLANAR CONTACTS

(71) Applicants: James R. Grandusky, Waterford, NY (US); Leo J. Schowalter, Latham, NY (US); Muhammad Jamil, Watervliet, NY (US); Mark C. Mendrick, Albany, NY (US); Shawn R. Gibb, Clifton Park, NY (US)

(72) Inventors: James R. Grandusky, Waterford, NY (US); Leo J. Schowalter, Latham, NY (US); Muhammad Jamil, Watervliet, NY (US); Mark C. Mendrick, Albany, NY (US); Shawn R. Gibb, Clifton Park, NY (US)

(73) Assignee: Crystal IS, Inc., Green Island, NY (US)

( * ) Notice: Subject to any disclaimer, the term of this patent is extended or adjusted under 35 U.S.C. 154(b) by 0 days.

(21) Appl. No.: 14/208,379

(22) Filed: Mar. 13, 2014

(65) Prior Publication Data

US 2014/0264263 A1    Sep. 18, 2014

Related U.S. Application Data

(60) Provisional application No. 61/788,141, filed on Mar. 15, 2013.

(51) Int. Cl.

| | |
|---|---|
| H01L 33/42 | (2010.01) |
| H01L 33/32 | (2010.01) |
| H01L 33/40 | (2010.01) |
| H01L 33/46 | (2010.01) |
| H01L 33/06 | (2010.01) |
| H01L 33/04 | (2010.01) |
| H01L 33/00 | (2010.01) |
| H01L 33/38 | (2010.01) |

(52) U.S. Cl.
CPC ............ *H01L 33/0075* (2013.01); *H01L 33/32* (2013.01); *H01L 33/325* (2013.01); *H01L 33/40* (2013.01); *H01L 33/405* (2013.01); *H01L 33/46* (2013.01); *H01L 33/04* (2013.01); *H01L 33/06* (2013.01); *H01L 33/387* (2013.01); *H01L 33/42* (2013.01); *H01L 2933/0016* (2013.01); *H01L 2933/0025* (2013.01)

(58) Field of Classification Search
USPC .......................................................... 257/13
See application file for complete search history.

(56) References Cited

U.S. PATENT DOCUMENTS

| | | |
|---|---|---|
| 3,531,245 A | 9/1970 | Dietz |
| 3,600,701 A | 8/1971 | Gouldthorpe |
| 3,603,414 A | 9/1971 | Stebley |

(Continued)

FOREIGN PATENT DOCUMENTS

| | | |
|---|---|---|
| CN | 2492947 Y | 5/2002 |
| CN | 201274297 Y | 7/2009 |

(Continued)

OTHER PUBLICATIONS

Vail et al., "The Nitrogen Vacancy in Aluminium Nitride", Journal of Physics: Condensed Matter, vol. 18, 2006, pp. 2125-2135.

(Continued)

*Primary Examiner* — Jarrett Stark
*Assistant Examiner* — Charles N Ausar-El
(74) *Attorney, Agent, or Firm* — Morgan, Lewis & Bockius LLP

(57) ABSTRACT

In various embodiments, light-emitting devices incorporate smooth contact layers and polarization doping (i.e., underlying layers substantially free of dopant impurities) and exhibit high photon extraction efficiencies.

17 Claims, 5 Drawing Sheets

(56) References Cited

U.S. PATENT DOCUMENTS

| | | | |
|---|---|---|---|
| 3,607,014 A | 9/1971 | Huml et al. |
| 3,634,149 A | 1/1972 | Verspui et al. |
| 3,768,983 A | 10/1973 | Elkins et al. |
| 3,903,357 A | 9/1975 | Woolfson |
| 3,933,573 A | 1/1976 | Dugger |
| 4,008,851 A | 2/1977 | Hirsch |
| 4,088,515 A | 5/1978 | Blakeslee et al. |
| 4,234,554 A | 11/1980 | Rabenau et al. |
| 4,547,471 A | 10/1985 | Huseby et al. |
| 5,057,287 A | 10/1991 | Swiggard |
| 5,070,393 A | 12/1991 | Nakagawa et al. |
| 5,087,949 A | 2/1992 | Haitz |
| 5,292,487 A | 3/1994 | Tatsumi et al. |
| 5,312,698 A | 5/1994 | Sato et al. |
| 5,494,861 A | 2/1996 | Yamaga et al. |
| 5,520,785 A | 5/1996 | Evans et al. |
| 5,525,320 A | 6/1996 | Pratsinis et al. |
| 5,571,603 A | 11/1996 | Utumi et al. |
| 5,670,798 A | 9/1997 | Schetzina |
| 5,679,965 A * | 10/1997 | Schetzina ............... 257/103 |
| 5,703,397 A | 12/1997 | Endo et al. |
| 5,728,635 A | 3/1998 | Kobayashi et al. |
| 5,858,085 A | 1/1999 | Arai et al. |
| 5,858,086 A | 1/1999 | Hunter |
| 5,868,837 A | 2/1999 | Disalvo et al. |
| 5,909,036 A | 6/1999 | Tanaka et al. |
| 5,924,874 A | 7/1999 | Gotoh et al. |
| 5,954,874 A | 9/1999 | Hunter |
| 5,972,109 A | 10/1999 | Hunter |
| 5,981,980 A | 11/1999 | Miyajima et al. |
| 6,000,174 A | 12/1999 | Yamazaki |
| 6,001,748 A | 12/1999 | Tanaka et al. |
| 6,006,620 A | 12/1999 | Lawrie et al. |
| 6,045,612 A | 4/2000 | Hunter |
| 6,048,813 A | 4/2000 | Hunter |
| 6,063,185 A | 5/2000 | Hunter |
| 6,066,205 A | 5/2000 | Hunter |
| 6,086,672 A | 7/2000 | Hunter |
| 6,091,085 A | 7/2000 | Lester |
| 6,187,089 B1 | 2/2001 | Phillips et al. |
| 6,211,089 B1 | 4/2001 | Kim et al. |
| 6,270,569 B1 | 8/2001 | Shibata et al. |
| 6,296,956 B1 | 10/2001 | Hunter |
| 6,398,867 B1 | 6/2002 | D'Evelyn et al. |
| 6,404,125 B1 | 6/2002 | Garbuzov et al. |
| 6,447,604 B1 | 9/2002 | Flynn et al. |
| 6,468,347 B1 | 10/2002 | Motoki et al. |
| 6,515,308 B1 | 2/2003 | Kneissl et al. |
| 6,533,874 B1 | 3/2003 | Vaudo et al. |
| 6,548,405 B2 | 4/2003 | Kraus et al. |
| 6,592,663 B1 | 7/2003 | Sarayama et al. |
| 6,596,079 B1 | 7/2003 | Vaudo et al. |
| 6,719,843 B2 | 4/2004 | Schowalter et al. |
| 6,770,135 B2 | 8/2004 | Schowalter et al. |
| 6,777,717 B1 | 8/2004 | Karlicek |
| 6,791,119 B2 | 9/2004 | Slater et al. |
| 6,800,876 B2 | 10/2004 | Edmond et al. |
| 6,831,302 B2 | 12/2004 | Erchak et al. |
| 6,840,431 B1 | 1/2005 | Kim |
| 6,861,729 B2 | 3/2005 | Kozaki et al. |
| 6,891,268 B2 | 5/2005 | Tomiya et al. |
| 6,921,929 B2 | 7/2005 | Leboeuf et al. |
| 6,936,357 B2 | 8/2005 | Melnik et al. |
| 6,940,075 B2 | 9/2005 | Schulz |
| 6,995,402 B2 | 2/2006 | Ludowise et al. |
| 7,026,659 B2 | 4/2006 | Slater et al. |
| 7,037,738 B2 | 5/2006 | Sugiyama et al. |
| 7,037,838 B2 | 5/2006 | Schowalter et al. |
| 7,056,383 B2 | 6/2006 | Helava et al. |
| 7,063,741 B2 | 6/2006 | D'Evelyn et al. |
| 7,087,112 B1 | 8/2006 | Rojo et al. |
| 7,095,054 B2 | 8/2006 | Fjelstad |
| 7,125,734 B2 | 10/2006 | Sackrison et al. |
| 7,186,580 B2 | 3/2007 | Tran et al. |
| 7,211,146 B2 | 5/2007 | Schowalter et al. |
| 7,211,831 B2 | 5/2007 | Erchak et |
| 7,244,520 B2 | 7/2007 | Kumakura et al. |
| 7,250,637 B2 | 7/2007 | Shimizu et al. |
| 7,274,043 B2 | 9/2007 | Erchak et al. |
| 7,276,779 B2 | 10/2007 | Shibata |
| 7,288,152 B2 | 10/2007 | Kitaoka et al. |
| 7,420,218 B2 | 9/2008 | Nagai |
| 7,420,222 B2 | 9/2008 | Slater et al. |
| 7,439,552 B2 | 10/2008 | Takigawa et al. |
| 7,476,910 B2 | 1/2009 | Fujimoto et al. |
| 7,518,158 B2 | 4/2009 | Keller et al. |
| 7,524,376 B2 | 4/2009 | Wang |
| 7,554,128 B2 | 6/2009 | Okamoto et al. |
| 7,631,986 B2 | 12/2009 | Harrah |
| 7,638,346 B2 | 12/2009 | Schowalter et al. |
| 7,641,735 B2 | 1/2010 | Slack et al. |
| 7,674,699 B2 | 3/2010 | Shibata |
| 7,678,195 B2 | 3/2010 | Schlesser et al. |
| 7,713,844 B2 | 5/2010 | Nishiura et al. |
| 7,750,355 B2 | 7/2010 | Dwilinski et al. |
| 7,755,103 B2 | 7/2010 | Ueno |
| 7,776,153 B2 | 8/2010 | Schowalter et al. |
| 7,803,733 B2 | 9/2010 | Teratani et al. |
| 7,902,566 B2 | 3/2011 | Paolini et al. |
| 7,943,952 B2 | 5/2011 | Loh et al. |
| 7,956,372 B2 | 6/2011 | Kamada et al. |
| 7,976,186 B2 | 7/2011 | Loh |
| 8,012,257 B2 | 9/2011 | Morgan et al. |
| 8,080,833 B2 * | 12/2011 | Grandusky ........ H01L 21/02389 |
| | | 257/103 |
| 8,088,220 B2 | 1/2012 | Slack et al. |
| 8,123,859 B2 | 2/2012 | Schowalter et al. |
| 8,222,650 B2 | 7/2012 | Schowalter et al. |
| 8,323,406 B2 | 12/2012 | Bondokov et al. |
| 8,349,077 B2 | 1/2013 | Bondokov et al. |
| 8,545,629 B2 | 10/2013 | Schowalter et al. |
| 8,580,035 B2 | 11/2013 | Bondokov et al. |
| 8,747,552 B2 | 6/2014 | Slack et al. |
| 8,834,630 B2 | 9/2014 | Bondokov et al. |
| 8,896,020 B2 | 11/2014 | Schowalter et al. |
| 8,962,359 B2 | 2/2015 | Schowalter et al. |
| 2001/0000209 A1 | 4/2001 | Krames et al. |
| 2001/0005023 A1 | 6/2001 | Itoh et al. |
| 2001/0024871 A1 | 9/2001 | Yagi |
| 2001/0051433 A1 | 12/2001 | Francis et al. |
| 2002/0030194 A1 | 3/2002 | Camras et al. |
| 2002/0170490 A1 | 11/2002 | Vodakov et al. |
| 2003/0047816 A1 | 3/2003 | Dutta |
| 2003/0160254 A1 | 8/2003 | Henrichs |
| 2003/0168003 A1 | 9/2003 | Schowalter et al. |
| 2003/0213964 A1 | 11/2003 | Flynn et al. |
| 2003/0216011 A1 | 11/2003 | Nakamura et al. |
| 2004/0033690 A1 | 2/2004 | Schowalter et al. |
| 2004/0104442 A1 | 6/2004 | Feudel et al. |
| 2004/0130002 A1 | 7/2004 | Weeks et al. |
| 2004/0187766 A1 | 9/2004 | Letertre |
| 2004/0206978 A1 | 10/2004 | Saxler |
| 2004/0213309 A9 | 10/2004 | Amano et al. |
| 2004/0224484 A1 | 11/2004 | Fareed et al. |
| 2004/0226917 A1 | 11/2004 | Laconto et al. |
| 2004/0245535 A1 | 12/2004 | D'Evelyn et al. |
| 2004/0251471 A1 | 12/2004 | Dwilinski et al. |
| 2005/0062392 A1 | 3/2005 | Sakai et al. |
| 2005/0072986 A1 | 4/2005 | Sasaoka |
| 2005/0103257 A1 | 5/2005 | Xu et al. |
| 2005/0142391 A1 | 6/2005 | Dmitriev et al. |
| 2005/0161697 A1 | 7/2005 | Nakahata et al. |
| 2005/0164044 A1 | 7/2005 | Melnik et al. |
| 2005/0214992 A1 | 9/2005 | Chakraborty et al. |
| 2005/0269577 A1 | 12/2005 | Ueda et al. |
| 2005/0277214 A1 | 12/2005 | Uematsu et al. |
| 2005/0285141 A1 | 12/2005 | Piner et al. |
| 2006/0005763 A1 | 1/2006 | Schowalter et al. |
| 2006/0029832 A1 | 2/2006 | Xu et al. |
| 2006/0054075 A1 | 3/2006 | Dwilinski et al. |
| 2006/0181695 A1 | 8/2006 | Sage |
| 2006/0244011 A1 | 11/2006 | Saxler |
| 2006/0255341 A1 | 11/2006 | Pinnington et al. |
| 2006/0281205 A1 | 12/2006 | Park |

(56) References Cited

U.S. PATENT DOCUMENTS

| | | |
|---|---|---|
| 2006/0288929 A1 | 12/2006 | Slack et al. |
| 2007/0018184 A1 | 1/2007 | Beeson et al. |
| 2007/0082019 A1 | 4/2007 | Huang et al. |
| 2007/0101932 A1 | 5/2007 | Schowalter et al. |
| 2007/0102721 A1 | 5/2007 | Denbaars et al. |
| 2007/0131160 A1 | 6/2007 | Slack et al. |
| 2007/0134827 A1 | 6/2007 | Bondokov et al. |
| 2007/0151905 A1 | 7/2007 | Wang et al. |
| 2007/0224714 A1 | 9/2007 | Ikeda et al. |
| 2007/0243653 A1 | 10/2007 | Morgan et al. |
| 2007/0257333 A1 | 11/2007 | Schlesser et al. |
| 2008/0006200 A1 | 1/2008 | Schowalter et al. |
| 2008/0012034 A1 | 1/2008 | Thielen et al. |
| 2008/0023719 A1 | 1/2008 | Camras et al. |
| 2008/0036038 A1 | 2/2008 | Hersee et al. |
| 2008/0054280 A1 | 3/2008 | Reginelli et al. |
| 2008/0087984 A1 | 4/2008 | Melas |
| 2008/0121910 A1 | 5/2008 | Bergmann et al. |
| 2008/0123711 A1* | 5/2008 | Chua et al. ............... 372/50.11 |
| 2008/0135861 A1 | 6/2008 | Pokrovskiy et al. |
| 2008/0142817 A1 | 6/2008 | Ibbetson et al. |
| 2008/0144688 A1 | 6/2008 | Chua et al. |
| 2008/0149945 A1 | 6/2008 | Nagai |
| 2008/0149960 A1 | 6/2008 | Amo et al. |
| 2008/0157111 A1 | 7/2008 | Erchak et al. |
| 2008/0173887 A1 | 7/2008 | Baba et al. |
| 2008/0182092 A1 | 7/2008 | Bondokov et al. |
| 2008/0187016 A1 | 8/2008 | Schowalter et al. |
| 2008/0191225 A1 | 8/2008 | Medendorp |
| 2008/0246047 A1 | 10/2008 | Hsu et al. |
| 2008/0251808 A1 | 10/2008 | Kususe et al. |
| 2008/0258165 A1 | 10/2008 | Zimmerman et al. |
| 2009/0008654 A1 | 1/2009 | Nagai |
| 2009/0014742 A1 | 1/2009 | Erchak |
| 2009/0039373 A1 | 2/2009 | Saito et al. |
| 2009/0050050 A1 | 2/2009 | Slack et al. |
| 2009/0065791 A1 | 3/2009 | Yen et al. |
| 2009/0065792 A1 | 3/2009 | Thompson et al. |
| 2009/0078957 A1 | 3/2009 | Hoshina |
| 2009/0090932 A1* | 4/2009 | Bour et al. ............... 257/103 |
| 2009/0121246 A1 | 5/2009 | Denbaars et al. |
| 2009/0121250 A1 | 5/2009 | Denbaars et al. |
| 2009/0140279 A1 | 6/2009 | Zimmerman et al. |
| 2009/0141502 A1 | 6/2009 | Sonoda et al. |
| 2009/0155969 A1 | 6/2009 | Chakravarti et al. |
| 2009/0155989 A1 | 6/2009 | Uematsu et al. |
| 2009/0159910 A1 | 6/2009 | Lin et al. |
| 2009/0166657 A1 | 7/2009 | Yamada et al. |
| 2009/0173958 A1 | 7/2009 | Chakraborty et al. |
| 2009/0233394 A1 | 9/2009 | Batres et al. |
| 2009/0239357 A1 | 9/2009 | Amano et al. |
| 2009/0256163 A1 | 10/2009 | Chakraborty |
| 2009/0261372 A1 | 10/2009 | Ueda |
| 2009/0267098 A1 | 10/2009 | Choi |
| 2009/0278148 A1 | 11/2009 | Nabekura et al. |
| 2009/0283028 A1 | 11/2009 | Schowalter et al. |
| 2009/0315054 A1 | 12/2009 | Kim et al. |
| 2009/0321758 A1 | 12/2009 | Liu et al. |
| 2009/0321771 A1 | 12/2009 | Hattori et al. |
| 2010/0006870 A1 | 1/2010 | Lee et al. |
| 2010/0012956 A1 | 1/2010 | Yoo |
| 2010/0025717 A1 | 2/2010 | Fujii et al. |
| 2010/0025719 A1 | 2/2010 | Li |
| 2010/0135349 A1 | 6/2010 | Schowalter et al. |
| 2010/0187541 A1 | 7/2010 | Slack et al. |
| 2010/0264460 A1* | 10/2010 | Grandusky et al. ............ 257/190 |
| 2010/0314551 A1 | 12/2010 | Bettles et al. |
| 2011/0008621 A1 | 1/2011 | Schujman et al. |
| 2011/0008923 A1 | 1/2011 | Lin et al. |
| 2011/0011332 A1 | 1/2011 | Schowalter et al. |
| 2012/0000414 A1 | 1/2012 | Bondokov et al. |
| 2012/0021175 A1 | 1/2012 | Moody et al. |
| 2012/0104355 A1* | 5/2012 | Grandusky ............ H01L 21/02389 257/13 |
| 2012/0146047 A1* | 6/2012 | Kneissl et al. ............... 257/76 |
| 2013/0026525 A1* | 1/2013 | Chen et al. ............... 257/98 |
| 2013/0082237 A1* | 4/2013 | Northrup et al. ............... 257/13 |
| 2013/0099141 A1* | 4/2013 | Chua ............... 250/504 R |
| 2013/0152852 A1 | 6/2013 | Bondokov et al. |
| 2013/0157442 A1 | 6/2013 | Bondokov et al. |
| 2014/0061666 A1 | 3/2014 | Schowalter et al. |
| 2014/0093671 A1 | 4/2014 | Bondokov et al. |
| 2014/0203311 A1 | 7/2014 | Schowalter et al. |
| 2014/0231725 A1 | 8/2014 | Slack et al. |
| 2015/0013592 A1 | 1/2015 | Bondokov et al. |
| 2015/0020731 A1 | 1/2015 | Bondokov et al. |
| 2015/0041760 A1* | 2/2015 | Han ............... H01L 33/06 257/13 |
| 2015/0079329 A1 | 3/2015 | Schowalter et al. |

FOREIGN PATENT DOCUMENTS

| | | |
|---|---|---|
| CN | 101680115 A | 3/2010 |
| CN | 103038400 A | 4/2013 |
| DE | 10248964 A1 | 4/2004 |
| EP | 0609799 A2 | 8/1994 |
| EP | 0811708 A2 | 12/1997 |
| EP | 0979883 A1 | 2/2000 |
| EP | 1211715 A2 | 6/2002 |
| EP | 1544925 A2 | 6/2005 |
| EP | 1732145 A2 | 12/2006 |
| EP | 1754810 A1 | 2/2007 |
| EP | 1852528 A1 | 11/2007 |
| EP | 2099068 A1 | 9/2009 |
| EP | 2287367 A1 | 2/2011 |
| EP | 2588651 A1 | 5/2013 |
| JP | 61-236686 A | 10/1986 |
| JP | 2-18379 A | 1/1990 |
| JP | 3-285075 A | 12/1991 |
| JP | 9-83016 A | 3/1997 |
| JP | 2000-31059 A | 1/2000 |
| JP | 2000-154090 A | 6/2000 |
| JP | 2001-192647 A | 7/2001 |
| JP | 2002-274996 A | 9/2002 |
| JP | 2003-197541 A | 7/2003 |
| JP | 2004-355920 A | 12/2004 |
| JP | 2005-167275 A | 6/2005 |
| JP | 2005-210084 A | 8/2005 |
| JP | 2005-536873 A | 12/2005 |
| JP | 2006-511432 A | 4/2006 |
| JP | 2006-169173 A | 6/2006 |
| JP | 2006-319107 A | 11/2006 |
| JP | 2006-335608 A | 12/2006 |
| JP | 2011-060986 A | 3/2011 |
| JP | 2013-32287 A | 2/2013 |
| JP | 2013-155112 A | 8/2013 |
| JP | 2013-542155 A | 11/2013 |
| WO | 99/34037 A1 | 7/1999 |
| WO | 00/22203 A2 | 4/2000 |
| WO | 01/11116 A1 | 2/2001 |
| WO | 03/007383 A2 | 1/2003 |
| WO | 03/081730 A2 | 10/2003 |
| WO | 2004/061896 A2 | 7/2004 |
| WO | 2005/012602 A1 | 2/2005 |
| WO | 2006/110512 A1 | 10/2006 |
| WO | 2007/062250 A2 | 5/2007 |
| WO | 2007/113537 A1 | 10/2007 |
| WO | 2008/042020 A2 | 4/2008 |
| WO | 2008/088838 A1 | 7/2008 |
| WO | 2012/003304 A1 | 1/2012 |
| WO | 2012/012010 A2 | 1/2012 |
| WO | 2014/151264 A1 | 9/2014 |

OTHER PUBLICATIONS

Van De Walle, Chris G., "DX-Center Formation in Wurtzite and Zinc-Blende Al$_x$Ga1—xN", Physics Review B, vol. 57, No. 4, Jan. 15, 1998, pp. R2033-R2036.

Van De Walle et al., "Doping of AlGaN Alloys", MRS Internet Journal Nitride Semiconductor Research., 4S1, G10.4, 1999, pp. 1-12.

Van De Walle et al., "First-Principles Calculations for Defects and Impurities: Applications to III-Nitrides", Journal of Applied Physics, vol. 95, No. 8, Apr. 15, 2004, pp. 3851-3879.

(56) References Cited

OTHER PUBLICATIONS

Vendl et al., "The Melting Points of Some Rare-Earth Metal Nitrides as a Function of Nitrogen Pressure", High Temperatures—High Pressures, vol. 9, 1977, pp. 313-318.
Venugopal et al., "Comparison of Various Buffer Schemes to Grow GaN on Large-Area Si(111) Substrates Using Metal-Organic Chemical-Vapor Deposition", Journal of Electronic Materials, vol. 32, No. 5, 2003, pp. 371-374.
"Multi-Year Program Plan FY'08-FY'13: Solid State Lighting Research and Development", Lighting Research and Development Building Technologies Program, U.S. Deptartment of Energy, Mar. 2007, 144 pages.
Khan, Asif, "AlGaN Based deep Ultraviolet Light Emitting Diodes with Emission from 250-280 nm", Abstract and Presentation at the International Workshop on Nitride Semiconductors in Pittsburg, PA, Jul. 19, 2004, 1 page.
Akiba et al., "Growth of Flat p-GaN Contact Layer by Pulse Flow Method for High Light-Extraction AlGaN Deep-UV LEDs with Al-Based Electrode", Phys. Status Solidi (C), vol. 9, No. 3-4, 2012, pp. 806-809.
Ali et al., "Enhancement of Near-UV GaN LED Light Extraction Efficiency by GaN/Sapphire Template Patterning", Semiconductor Science and Technology, vol. 27, 2012, pp. 1-5.
Arulkumaran et al., "Improved dc Characteristics of AlGaN/GaN High-Electron-Mobility Transistors on AlN/Sapphire Templates", Applied Physics Letters, vol. 81, No. 6, Aug. 5, 2002, pp. 1131-1133.
Atobe et al., "F-Type Centers in Neutron-Irradiated AlN", Japanese Journal of Applied Physics, vol. 29, No. 1, Jan. 1990, pp. 150-152.
Balkas et al., "Sublimation Growth and Characterizations of Bulk Aluminum Nitride Single Crystals", Journal of Crystal Growth, vol. 179, 1997, pp. 363-370.
Ban et al., "Ir/Ag Reflector for High-Performance GaN-Based Near UV Light Emitting Diodes", Materials Science and Engineering B, vol. 133, 2006, pp. 26-29.
Barin, Ihsan, "Thermochemical Data of Pure Substances", Second Edition, VCH, 1993, 13 pages.
Bennett et al., "High Quality InGaAs/InP and InAlAs/InP Heterostructures Beyond the Matthews-Blakeslee Critical Layer Thickness", 4th Annual conference on InP and Related Materials, Newport, RI, 1992, pp. 650-653.
Berzina et al., "Luminescence Mechanisms of Oxygen-Related Defects in AlN", Radiation Effects & Defects in Solids, vol. 157, 2002, pp. 1089-1092.
Bickerman et al., "Polarization Dependent Below Band-Gap Optical Absorption of Aluminium Nitride Bulk Crystals", Journal of Applied Physics, vol. 103, 2008, pp. 073522-1-073522-3.
Bickerman et al., "PVT Growth of Bulk AlN Crystals with Low Oxygen Contamination", Physica Status Solidi (C), No. 7, Dec. 2003, pp. 1993-1996.
Bickermann et al., "Characterization of Bulk AlN with Low Oxygen Content", Journal of Crystal Growth, vol. 269, 2004, pp. 432-442.
Bickermann et al., "Point Defect Content and Optical Transitions in Bulk Aluminum Nitride Crystals", Physica Status Solidi (B), vol. 246, No. 6, 2009, pp. 1181-1183.
Bockowski et al., "Combustion Synthesis of Aluminum Nitride Under High Pressure of Nitrogen and Nitrogen-Argon Mixtures", Journal of Material Synthesis & Processing, vol. 5, No. 6, 1997, pp. 449-458.
Bolgar et al., "Vaporization of the Nitirides of B, Al, and Ga", Khim Fiz. Nitrodov Chem. Abstr. 71, 34003j, 1968, pp. 151-156 (English Abstract Included).
Bradley et al., "Deep Level Defects and Doping in High Al mole Fraction AlGaN", Journal of Vacuum Science & Technology B, vol. 21, No. 6, 2003, pp. 2558-2563.
Brunner et al., "Optical Constants of Epitaxial AlGaN Films and Their Temperature Dependence", Journal of Applied Physics, vol. 82, No. 10, Nov. 15, 1997, pp. 5090-5096.
Chase et al., "JANAF Thermochemical Tables, Third Edition, Part I, Al—Co", J. Phys. Chern. Ref. Data, vol. 14, Suppl. No. 1, 1985, 2 pages.
Chase, Jr., Malcolm W., "NIST-JANAF Thermochemical Tables, Fourth Edition, Part I, Al—Co", J. Phys. Chern., Ref. Data, Monograph No. 9, 1998, 8 pages.
Cheng et al., "Light Output Enhancement of UV Light-Emitting Diodes with Embedded Distributed Bragg Reflector", IEEE Photonics Technology Letters, vol. 23, No. 10, May 15, 2011, pp. 642-644.
Cheong et al., "Structural and Optical Properties of Near-UV LEDs Grown on V-Grooved Sapphire Substrates Fabricated by Wet Etching", Journal of Crystal Growth, vol. 298, 2007, pp. 699-702.
Chitnis et al., "Milliwatt Power AlGaN Quantum Well Deep Ultraviolet Light Emitting Diodes", Phys. Stat. Sol. (a), vol. 200, No. 1, 2003, pp. 99-101.
Chiu et al., "Efficiency Enhancement of UV/blue Light Emitting Diodes Via Nanoscaled Epitaxial Lateral Overgrowth of GaN on a SiO2 Nanorod-Array Patterned Sapphire Substrate", Journal of Crystal Growth, vol. 310, 2008, pp. 5170-5174.
Collins et al., "Lattice Vibration Spectra of Aluminum Nitride", Physical Review, vol. 158, No. 3, Jun. 15, 1967, pp. 833-838.
Constantin et al., "Mixing Rocksalt and Wurtzite Structure Binary Nitrides to form Novel Ternary Alloys: ScGaN and MnGaN", Mat. Res. Soc. Symp. Proc., vol. 799, 2004, pp. Z9.5.1-Z9.5.6.
Cox et al., "On the Preparation, Optical Properties and Electrical Behaviour of Aluminum Nitride", J. Phys. Chem. Solids, vol. 28, 1967, pp. 543-548.
Dalmau et al., "Crucible Selection in AlN Bulk Crystal Growth", Mat. Res. Soc. Symp. Proc., vol. 798, 2004, pp. Y2.9.1-Y2.9.5.
Devries et al., "Phase Equilibria Pertinent to the Growth of Cubic Boron Nitride", Journal of Crystal Growth, vol. 13/14, 1972, pp. 88-92.
Dong et al., "Ultraviolet Electroluminescence from Ordered ZnO Nanorod Array/p-GaN Light Emitting Diodes", Applied Physics Letters, vol. 100, 2012, pp. 171109-1-171109-4.
Dryburgh, P. M., "The Estimation of Maximum Growth Rate for Aluminum Nitride Crystals Grown by Direct Sublimation", Journal of Crystal Growth, vol. 125, 1992, pp. 65-68.
Dugger, Cortland O., "The Single Crystal Synthesis and Some Properties of Aluminum Nitride", Physical Science Research Papers, No. 656, Aug. 1, 1975, 67 pages.
Dugger, Cortland O., "The Synthesis of Aluminum Nitride Single Crystals", Mat. Res. Bull.,vol. 9, 1974, pp. 331-336.
Edgar et al., "Native Oxide and Hydroxides and Their Implications for Bulk AlN Crystal Growth", 2008, pp. 1-15.
Epelbaum et al., "Natural Growth Habit of Bulk AlN Crystals", Journal of Crystal Growth, vol. 265, No. 3-4, 2004, pp. 577-581.
Epelbaum et al., "Sublimation Growth of Bulk AlN Crystals: Materials Compatibility and Crystal Quality", Mat. Sci. Forum, vols. 389-393, 2002, pp. 1445-1448.
Evans et al., "Electron Paramagnetic Resonance of a Donor in Aluminum Nitride Crystals", Applied Physics Letter, vol. 88, 2006, pp. 06112-1-06112-3.
Freitas et al., "Properties of Bulk AlN Grown by Thermodecomposition of AlCl3.NH3", Applied Physics Letters, vol. 83, No. 13, Sep. 29, 2003, pp. 2584-2586.
Freitas et al., "Shallow Donors in GaN", Physica Status Solidi (B), vol. 240, No. 2, 2003, pp. 330-336.
Freitas, James A., "Optical Studies of Bulk and Homoepitaxial Films of III-V Nitride Semiconductors", Journal of Crystal Growth, vol. 281, 2005, pp. 168-182.
Gaska et al., "Deep-Ultraviolet Emission of AlGaN/AlN Quantum Wells on Bulk AlN", Applied Physics Letters, vol. 81, No. 24, Dec. 9, 2002, pp. 4658-4660.
Gauckler et al., "Representation of Multicomponent Silicon Nitride Based Systems", Proceedings of NATO Advanced Study Institute on Nitrogen Ceramics, 1977, 4 pages.
Gorbatov et al., "Electrical Conductivity of Materials from Mixed Aluminum and Silicon Nitrides", Soviet Powder Metallurgy and Metal Ceramics, vol. 9, 1970, pp. 917-920.
Gutierrez et al., "The Formation of Nanopipes Caused by Donor Impurities in GaN: A Theoretical Study for the Case of Oxygen", Philosophical Magazine Letters, vol. 79, No. 3, 1999, pp. 147-152.
Gutt et al., "AlGaN-Based 355 nm UV Light-Emitting Diodes with High Power Efficiency", Applied Physics Express, vol. 5, 2012, p. 032101 (3 pages).

(56) References Cited

OTHER PUBLICATIONS

Hacke et al., "Photoluminescence Intensity and Spectral Distribution of GaN Films on SiC Substrates—The Dependence on Dislocation Density and Structure", Phys. Stat. Sol. (b), vol. 216, 1999, pp. 639-644.
Hermann et al., "Highly Si-doped AlN Grown by Plasma-Assisted Molecular-Beam Epitaxy", Applied Physics Letters, vol. 86, 2005, pp. 192108-1-192108-3.
Honda et al., "Electron Paramagnetic Center in Neutron-Irradiated AlN", Japanese Journal of Applied Physics, vol. 29, No. 4, Apr. 1990., pp. L652-L654.
Hong et al., "Enhanced Light Output of GaN-Based Near-UV Light Emitting Diodes by Using Nanopatterned Indium Tin Oxide electrodes", Semiconductor Science and Technology, vol. 21, 2006, pp. 594-597.
Noveski et al., "Mass Transfer in AlN Crystal Growth at High Temperatures", Journal of Crystal Growth, vol. 264, 2004, pp. 369-378.
Pantha et al., "Correlation between Biaxial Stress and Free Exciton Transition in AlN Epilayers", Applied Physics Letters, vol. 91, 2007, pp. 121117-1-201117-3.
Park et al., "Study on Photoluminescence of GaN-Based UV-LEDs with Refractive Index Gradient Polymeric Nanopatterns", Journal of Crystal Growth, vol. 326, 2011, pp. 28-32.
Parker et al., "Determination of the Critical Layer Thickness in the InGaN/GaN Heterostructures", Applied Physics Letters, vol. 75, No. 18, Nov. 1, 1999, pp. 2776-2778.
Pernot et al., "Improved Efficiency of 255-280 nm AlGaN-Based Light-Emitting Diodes", Applied Physics Express, vol. 3, 2010, p. 061004 (3 pages).
Perry et al., "The Optical Absorption Edge of Single-Crystal AlN Prepared by a Close-Spaced Vapor Process", Applied Physics Letter, vol. 33, No. 4, Aug. 15, 1978, pp. 319-321.
Raghothamachar et al., "Synchrotron White Beam Topography Characterization of Physical Vapor Transport Grown AlN and Ammonothermal GaN", Journal of Crystal Growth, vol. 246, 2002, pp. 271-280.
Raghothamachar et al., "X-ray Characterization of Bulk AlN Single Crystals Grown by the Sublimation Technique", Journal of Crystal Growth, vol. 250, 2003, pp. 244-250.
Rojo et al., "Growth and Characterization of Epitaxial Layers on Aluminum Nitride Substrates Prepared from Bulk, Single Crystals", Journal of Crystal Growth, vol. 240, 2002, pp. 508-512.
Rojo et al., "Progress in the Preparation of Aluminum Nitride Substrates from Bulk Cystals", Mat. Res. Soc. Svmp. Pro., vol. 722, 2002, pp. K1.1.1-K1.1.9.
Rojo et al., "Report on the Growth of Bulk Aluminum Nitride and Subsequent Substrate Preparation", Journal of Crystal Growth, vol. 231, 2001, pp. 317-321.
Salzman et al., "Reduction of Oxygen Contamination in AlN", Physica Status Solidi (c), 2003, pp. 2541-2544.
Sarua et al., "Effect of Impurities on Raman and Photoluminescence Spectra of AlN Bulk Crystals", Materials Research Society Symposium Proceedings, vol. 798, 2004, pp. Y5.17.1-Y5.17.6.
Schlesser et al., "Crucible Materials for Growth of Aluminium Nitride Crystals", Journal of Crystal Growth, vol. 281, 2005, pp. 75-80.
Schlesser et al., "Growth of AlN Bulk Crystals from the Vapor Phase", Material Research Society Symp. Proc., vol. 693, 2002, pp. I9.4.1-I9.4.6.
Schlesser et al., "Seeded Growth of AlN Bulk Single Crystals by Sublimation", Journal of Crystal Growth, vol. 241, 2002, pp. 416-420.
Schowalter et al., "Fabrication of Native, Single-Crystal AlN Substrates", Physica Status Solidi (c), 2003, pp. 1-4.
Schujman et al., "Very Low Dislocation Density AlN Substrates for Device Applications", Proc. of SPIE, 2006, vol. 6121, 2006, pp. 61210K-1-61210K-7.
Schweizer et al., "Investigation of Oxygen-Related Luminescence Centres in AlN Ceramics", Physica Status Solidi (b), vol. 219, No. 1, 2000, pp. 171-180.

Sedhain et al., "Photoluminescence Properties of AlN Homoepilayers with Different Orientations", Applied Physics Letters, vol. 93, 2008, pp. 041905-1-041905-3.
Segal et al., "On Mechanisms of Sublimation Growth of AlN bulk Crystals", Journal of Crystal Growth, vol. 211, 2000, pp. 68-72.
Seo et al., "Enhanced Light Output Power of Near UV Light Emitting Diodes with Graphene / Indium Tin Oxide Nanodot Nodes for Transparent and Current Spreading Electrode", Optics Express, vol. 9, No. 23, Nov. 7, 2011, pp. 23111-23117.
Shakya et al., "III-Nitride Blue and UV Photonic Crystal Light-Emitting Diodes", Fourth International Conference on Solid State Lighting, Proc. of SPIE, vol. 5530, pp. 241-250.
Shatalov et al., "AlGaN Deep-Ultraviolet Light-Emitting Diodes with External Quantum Efficiency above 10%", Applied Physics Express, vol. 5, 2012, pp. 082101(3 pages).
Shi et al., "Luminescence Properties of Wurtzite AlN Nanotips", Applied Physics Letters, vol. 89, 2006, pp. 163127-1-163127-3.
Shih et al., "High-Quality and Crack-Free Al $_x$Ga1-xN (x-0.2) Grown on Sapphire by a Two-Step Growth Method", Journal of Crystal Growth, vol. 277, 2005, pp. 44-50.
Silveira et al., "Excitonic Structure of Bulk AlN from Optical Reflectivity and Cathodoluminescense Measurements", Physical Review B, vol. 71, 2005, pp. 041201-1-041201-4.
Singh et al., "Physical Vapor Transport Growth of Large AlN Crystals", Journal of Crystal Growth, vol. 250, 2003, pp. 107-112.
Slack et al., "AlN Single Crystals", Journal of Crystal Growth, vol. 42, 1977, pp. 560-563.
Slack et al., "Growth of High Purity AlN Crystals", Journal of Crystal Growth, vol. 34, 1976, pp. 263-279.
Slack et al., "Properties of Crucible Materials for Bulk Growth of AlN", Materials Research Society Symposium Proceedings, vol. 798, 2004, pp. Y10.74.1-Y10.74.4.
Slack et al., "Some Effects of Oxygen Impurities on AlN and GaN", Journal of Crystal Growth, vol. 246, 2002, pp. 287-298.
Smart et al., "AlGaN/GaN Heterostructures on Insulating AlGaN Nucleation Layers", Applied Physics Letters, vol. 75, No. 3, Jul. 10, 1999, pp. 388-390.
Song, T. L. , "Strain Relaxation Due to V-Pit Formation in InxGa1-xN/GaN Epilayers Grown on Sapphire", Journal of Applied Physics, vol. 98, 2005, pp. 084906-1-084906-9.
Stampfl et al., "Theoretical Investigation of Native Defects, Impurities and Complexes in Aluminium Nitride", Physical Review B, vol. 65, 2002, pp. 155212-1-155212-10.
Strassburg et al., "The Growth and Optical Properties of Large, High-Quality AlN Single Crystals", Journal of Applied Physics, vol. 96, No. 10, Nov. 15, 2004, pp. 5870-5876.
Sun et al., "Phase Relationships in the System Y—Al—O—N", Materials Letters, vol. 11, No. 3,4, May 1991, pp. 67-69.
Takehara et al., "Indium—Tin Oxide/Al Reflective Electrodes for Ultraviolet Light-Emitting Diodes", Japanese Journal of Applied Physics, vol. 51, 2012, p. 042101 (4 pages).
Takeuchi et al., "Optical Properties of Strained AlGaN and GaInN on GaN", Japanese Journal of Applied Physics, vol. 36, Part 2, No. 2B, Feb. 15, 1997, pp. L177-L179.
Takeya et al., "Degradation in AlGaInN Lasers", Physica Status Solidi (c), 2003, pp. 2292-2295.
Taniyasu et al., "An Aluminium Nitride Light-Emitting Diode with a Wavelength of 210 Nanometres", Nature, vol. 441, May 18, 2006, pp. 325-328.
Taniyasu et al., "Intentional Control of N-Type Conduction for Si-Doped AlN and AlxGa1-xN (0.42<x<1)", Applied Physics Letters, vol. 81, No. 7, Aug. 12, 2002, pp. 1255-1257.
Tavernier et al., "Chemical Mechanical Polishing of Gallium Nitride", Electrochemical and Solid State Letters, vol. 5, No. 8, 2002, pp. G61-G64.
Thomas et al., "Determination of the Concentration of Oxygen Dissolved in the AlN Lattice by Hot Gas Extraction from AlN Ceramics", Journal of European Society, vol. 8, 1991, pp. 11-19.
Tomiya et al., "Dislocations in GaN-Based Laser Diodes on Epitaxial Lateral Overgrown GaN Layers", Physica Status Solidi (a), vol. 188, No. 1, 2001, pp. 69-72.

(56) References Cited

OTHER PUBLICATIONS

Trinkler et al., "Radiation Induced Recombination Processes in AlN Ceramics", Journal of Physics: Condensed Matter, vol. 13, 2001, pp. 8931-8938.

Trinkler et al., "Spectral Properties of AlN Ceramics", SPIE, vol. 2967, 1997, pp. 85-88.

Trinkler et al., "Stimulated Luminescence of AlN Ceramics Induced by Ultraviolet Radiation", Radiation Measurements, vol. 33, 2001, pp. 731-735.

Tsao, Jeff Y., "Solid-State Lighting: Lamps, Chips and Materials for Tomorrow", Circuits and Devices Magazine, IEEE, May/Jun. 2004, pp. 28-37.

Tuomisto et al., "Characterization of Bulk AlN Crystals with Positron Annihilation Spectroscopy", Journal of Crystal Growth, 2008, pp. 1-4.

Hong et al., "Fabrication of Moth-Eye Structure on p-GaN Layer of GaN-Based LEDs for Improvement of Light Extraction", Materials Science and Engineering B, vol. 163, 2009, pp. 170-173.

Honig, Richard E., "Vapor Pressure Data for the Solid and Liquid Elements", RCA Review, vol. 23, 1962, 4 pages.

Hossain et al., "Study of Cathodoluminescence Spectroscopy of Aluminum Nitride", SPIE, vol. 2877, 1996, pp. 42-45.

Hsu et al., "Optimizing Textured Structures Possessing Both Optical Gradient and Diffraction Properties to Increase the Extraction Efficiency of Light-Emitting Diodes", Photonics and Nanostructures—Fundamentals and Applications, 2012, pp. 1-11.

Inazu et al., "Improvement of Light Extraction Efficiency for AlGaN-Based Deep Ultraviolet Light-Emitting Diodes", Japanese Journal of Applied Physics, vol. 50, 2011, p. 122101 (3 pages).

Iwaya et al., "Improvement of Light Extraction Efficiency of UV-LED Grown on Low-Dislocation-Density AlGaN", Phys. Stat. Sol. (a), vol. 200, No. 1, 2003, pp. 110-113.

Jahnen et al., "Pinholes, Dislocations and Strain Relaxation in InGaN", MRS Internet Journal Nitride Semiconductor Research, vol. 3, No. 39, 1998, pp. 1-10.

Jeong et al., "InGaN/AlGaN Ultraviolet Light-Emitting Diode with a Ti3O5/Al2O3 Distributed Bragg Reflector", Japanese Journal of Applied Physics, vol. 47, No. 12, 2008, pp. 8811-8814.

Jones et al., "Optical Properties of AlN Determined by Vacuum Ultraviolet Spectroscopy and Spectroscopic Ellipsometry Data", Journal of Materials Research, vol. 14, No. 11, 1999, pp. 4337-4344.

Kanechika et al., "n-type AlN Layer by Si Ion Implantation", Applied Physics Letters, vol. 88, 2006, pp. 202106-1-202106-2.

Karel et al., "The Luminescence Properties of AlN with Manganese and Rare Earth Activators Under Ultraviolet and Cathode-Ray Excitation", Czechoslovak Journal of Physics B., vol. 20, 1970, pp. 46-55.

Karpinski et al., "Equilibrium Pressure of N2 Over GaN and High Pressure Solution Growth of GaN", Journal of Crystal Growth, vol. 66, 1984, pp. 1-10.

Karpov et al., "Sublimation Growth of AlN in Vacuum and in a Gas Atmosphere", Phys. Stat. Sol. (a), vol. 176, 1999, pp. 435-438.

Kasu et al., "Formation of Solid Solution of Al1-xSixN ($0<x \leq 12\%$) Ternary Alloy", Jpn. J. Appl. Phys., vol. 40, Part 2, No. 10A, 2001, pp. L1048-L1050.

Kasugai et al., "High-Efficiency Nitride-Based Light-Emitting Diodes with Moth-Eye Structure", Japanese Journal of Applied Physics, vol. 44, No. 10, 2005, pp. 7414-7417.

Katayama-Yoshida et al., "Codoping Method for the Fabrication of Low-Resistivity Wide Band-Gap Semiconductors in p-Type GaN, p-Type AlN and n-Type Diamond: Prediction Versus Experiment", Journal of Physics: Condensed Matter, vol. 13, 2001, pp. 8901-8914.

Kawabe et al., "Electrical and Optical Properties of AlN—a Thermostable Semiconductor", Elec. Engin. in Japan, vol. 87, 1967, pp. 62-70.

Kazan et al., "Oxygen Behavior in Aluminum Nitride", Journal of Applied Physics, vol. 98, 2005, pp. 103529-1-103529-4.

Kazan et al., "Phonon Dynamics in AlN Lattice Contaminated by Oxygen", Diamond & Related Materials, vol. 15, 2006, pp. 1525-1534.

Kim et al., "Enhancement of Light Extraction Efficiency of Ultraviolet Light Emitting Diodes by Patterning of Sio2 Nanosphere Arrays", Thin Solid Films, vol. 517, 2009, pp. 2742-2744.

Klemens, P G., "Effect of Point Defects on the Decay of the Longitudinal Optical Mode", Physica B, vol. 316-317, 2002, pp. 413-416.

Kordis, J., "The BeO—MgO System", Journal of Nuclear Materials, vol. 14, 1964, pp. 322-325.

Kovalenkov et al., "Thick AlN Layers Grown by HVPE", Journal of Crystal Growth, vol. 281, 2005, pp. 87-92.

Lawson et al., "Preparation of Single Crystals", Semi-Conductor Monographs, 1958, pp. 18-21.

Lee et al., "Light Extraction Analysis of GaN-Based Light-Emitting Diodes with Surface Texture and/or Patterned Substrate", Optics Express, vol. 15, No. 11, 2007, pp. 6670-6676.

Liu et al., "A Global Growth Rate Model for Aluminum Nitride Sublimation", Journal of the Electrochemical Society, vol. 149, No. 1, 2002, pp. G12-G15.

Liu et al., "Characterization of Aluminum Nitride Crystals Grown by Sublimation", Phys. Stat. Sol. (a), vol. 188, No. 2, 2001, pp. 769-774.

Liu et al., "Misfit Dislocation Generation in InGaN Epilayers on Free-Standing GaN", Japanese Journal of Applied Physics, vol. 46, No. 22, 2006, pp. L549-L551.

Lobo et al., "Enhancement of Light Extraction in Ultraviolet Light-Emitting Diodes using Nanopixel Contact Design with Al Reflector", Applied Physics Letters, vol. 96, 2010, pp. 081109-1-081109-3.

Ludwig et al., "Dimers [Al2N4]", Zeitsch. f. Naturforsch., B54, 1999, pp. 461-465.

Maier et al., "Enhancement of (AlGaIn)N near-UV LED Efficiency Using Freestanding GaN Substrate", Physica Status Solidi (c), vol. 5, No. 6, 2008, pp. 2133-2135.

Mason et al., "Optically Detected Electron Paramagnetic Resonance of AlN Single Crystals", Physical Review B, vol. 59, No. 3, Jan. 15, 1999, pp. 1937-1947.

Matthews et al., "Defects in Epitaxial Multilayers", Journal of Crystal Growth, vol. 27, 1974, p. 118-125.

McCluskey et al., "Metastability of Oxygen Donors in AlGaN", Physical Review Letters, vol. 80, No. 18, May 4, 1998, pp. 4008-4011.

Meyer et al., "Defects and Defect Identication in Group III-Nitrides", Material Science Engineering, vol. B71, 2000, pp. 69-76.

Mokhov et al., "Sublimation Growth of AlN Bulk Crystals in Ta Crucibles", Journal of Crystal Growth, vol. 281, 2005, pp. 93-100.

Morita et al., "Optical Absorption and Cathodoluminescence of Epitaxial Aluminum Nitride Films", Japanese Journal of Applied Physics, vol. 21, No. 7, 1982, pp. 1102-1103.

Naidu et al., "Phase Diagrams of Binary Tungsten Alloys", Indian Institute of Metals, Calcutta, 1991, 11 pages.

Nakahata et al., "Electron Spin Resonance Analysis of Lattice Defects in Polycrystalline Aluminum Nitride", Journal of the American Ceramic Society, vol. 80, No. 6, Jun. 1997, pp. 1612-1614.

Nakanishi et al., "Effects of Al Composition on Luminescence Properties of Europim Implanted AlxGa1-xN ($0 \leq x \leq 1$)", Physica Status Solidi (c), vol. 0, No. 7, 2003, pp. 2623-2626.

Nakarmi et al., "Photoluminescence Studies of Impurity Transitions Mg-Doped AlGaN Alloys", Applied Physics Letters, vol. 94, 2009, pp. 091903-1-091903-3.

Nam et al., "Deep Impurity Transitions Involving Cation Vacancies and Complexes in AlGaN Alloys", Applied Physics Letters, vol. 86, 2005, pp. 222108-1-222108-3.

Nassau, Kurt, "The Physics and Chemistry of Color: The Fifteen Causes of Color", Wiley-Interscience Publication, 1983, 3 pages.

Nepal et al., "Optical Properties of the Nitrogen Vacancy in AlN Epilayers", Applied Physics Letters, vol. 84, No. 7, Feb. 16, 2004, pp. 1090-1092.

Nepal et al., "Photoluminescence Studies of Impurity Transitions in AlGaN Alloys", Applied Physics Letters, vol. 89, 2006, pp. 092107-1-092107-3.

Niewa et al., "Li3[ScN2]: The First Nitridoscandate (III)—Tetrahedral Sc Coordination and Unusual MX2 Framework", Chemistry—A European Journal, vol. 9, 2003, pp. 4255-4259.

Niewa et al., "Recent Developments in Nitride Chemistry", Chemical of Materials, vol. 10, No. 10, Oct. 2, 1998, pp. 2733-2752.

(56) References Cited

OTHER PUBLICATIONS

Nishida et al., "340-350 nm GaN-free UV-LEDs", Physica Status Solidi (a), vol. 200, No. 1, 2003, pp. 106-109.
Nishida et al., "AlGaN-Based Ultraviolet Light-Emitting Diodes Grown on Bulk AlN Substrates", Applied Physics Letters, vol. 84, No. 6, Feb. 9, 2004, pp. 1002-1003.
Noveski et al., "Growth of AlN Crystals on AlN/SiC Seeds by AlN Powder Sublimation in Nitrogen Atmosphere", MRS Internet Journal Nitride Semiconductor Research, vol. 9, No. 2, 2004, pp. 1-6.
Examination Report received for European Application No. 02803675.4, mailed on May 2, 2007, 4 pages.
Examination Report received for European Application No. 02806723.9, mailed on Jan. 17, 2008, 4 pages.
Examination Report received for European Application No. 02806723.9, mailed on Feb. 7, 2007, 4 pages.
Examination Report received for European Application No. 02806723.9, mailed on Feb. 16, 2010, 2 pages.
Examination Report received for European Application No. 02806723.9, mailed on Aug. 8, 2008, 3 pages.
Examination Report received for European Application No. 03808366.3 mailed on Sep. 28, 2006, 4 pages.
Summons to Attend Oral Proceedings in European Patent Application No. 03808366.3, mailed on Dec. 17, 2007, 5 pages.
Examination Report received for European Application No. 06844804.2, mailed on Mar. 4, 2009, 3 pages.
Examination Report received for European Application No. 07774299.7, mailed on Jul. 25, 2014, 6 pages.
Examination Report received for Canadian Application No. 2,467,806, mailed on Feb. 23, 2010, 2 pages.
Examination Report received for Canadian Patent Application No. 2,467,806, mailed on Aug. 13, 2009, 4 pages.
Examination Report received for Australian Application No. 2003303485, mailed on Oct. 9, 2008, 2 pages.
Examination Report received for Japanese Application No. 2003-545445, mailed on Sep. 30, 2008, 3 pages (English Translation only).
Examination Report received for Japanese Application No. 2003-545445, mailed on Nov. 10, 2009, 3 pages (English Translation only).
Examination Report received for Chinese Application No. 200680045153.1, mailed on Oct. 13, 2010, 6 pages (English Translation only).
Examination Report received for Chinese Application No. 200780018103.9, mailed on Apr. 6, 2011, 6 pages (English Translation only).
Examination Report received for Japanese Application No. 2008-543389, mailed on Aug. 16, 2013, 6 pages (English Translation only).
Examination Report received for Japanese Application No. 2008-543389, mailed on May 22, 2012, 6 pages (English Translation only).
Examination Report received for Japanese Application No. 2008-543541, mailed on May 15, 2012, 4 pages (English Translation only).
Examination Report received for Chinese Application No. 200880005464.4, mailed on Mar. 31, 2014, 2 pages (English Translation only).
Examination Report received for Chinese Application No. 200880005464.4, mailed on Jul. 3, 2014, 3 pages (English Translation only).
Examination Report received for Chinese Application No. 200880005464.4, mailed on Sep. 9, 2013, 10 pages (7 pages of English Translation).
Notice of Allowance received for Japanese Application No. 2009-503043, mailed on Jan. 21, 2014, 3 pages (2 pages of English Translation).
Examination Report received for Japanese Application No. 2009-547307, mailed on Apr. 8, 2014, 4 pages.
Examination Report received for Japanese Application No. 2013-518701, mailed on Sep. 24, 2014, 2 pages (English Translation only).
PCT International Application No. PCT/US2006/022329, International Preliminary Report on Patentability issued on Dec. 11, 2007, 7 pages.
PCT International Application No. PCT/US2006/022329, International Search Report and Written Opinion mailed on Dec. 12, 2006, 10 pages.
PCT International Application No. PCT/US2006/045540, International Preliminary Report on Patentability issued on Jun. 3, 2008, 12 pages.
PCT International Application No. PCT/US2006/045540, International Search Report and Written Opinion mailed on Jul. 6, 2007, 18 pages.
PCT International Application No. PCT/US2006/046300, International Preliminary Report on Patentability, issued on Jun. 4, 2008, 7 pages.
PCT International Application No. PCT/US2006/046300, International Search Report and Written Opinion mailed on May 30, 2007, 10 pages.
PCT International Application No. PCT/US2007/011075, International Search Report and Written Opinion mailed on Jul. 11, 2008, 15 pages.
PCT International Application No. PCT/US2007/007980, International Search Report and Written Opinion mailed on Oct. 12, 2007, 14 pages.
PCT International Application No. PCT/US2007/011075, Partial International Search Report mailed on May 7, 2008, 2 pages.
PCT International Application No. PCT/US2008/000597, International Search Report and Written Opinion mailed on May 20, 2008, 9 pages.
PCT International Application No. PCT/US2008/000597, International Preliminary Report on Patentability mailed on Jul. 30, 2009, 7 pages.
PCT International Application No. PCT/US2008/001003, International Search Report and Written Opinion mailed on Aug. 5, 2008, 9 pages.
PCT International Application No. PCT/US2008/001003, International Preliminary Report on Patentability mailed on Aug. 6, 2009, 7 pages.
PCT International Application No. PCT/US2011/042571, International Search Report and Written Opinion mailed on Sep. 19, 2011, 14 pages.
PCT International Application No. PCT/US2014/025317, International Search Report and Written Opinion mailed Aug. 27, 2014, 13 pages.
Vinogradov et al., "Determination of the Melting Parameters of Aluminum Nitride", High Temperatures—High Pressures, vol. 23, 1991, pp. 685.
Watanabe et al., "Changes in Optical Transmittance and Surface Morphology of AlN Thin Films Exposed to Atmosphere", Journal of Materials Research, vol. 13, No. 10, Oct. 1998, pp. 2956-2961.
Wentorf, R. H., Jr., "Synthesis of the Cubic Form of Boron Nitride", Journal of Chemical Physics, vol. 34, No. 3, Mar. 1961, pp. 809-812.
Wierer, Jonathan J., Jr., "Light Extraction Methods in Light-Emitting Diodes", Optical Society of America/CLEO, 2011, 2 pages.
Wongchotigul et al., "Low Resistivity Aluminum Nitride:Carbon (AlN:C) Films Grown by Metal Organic Chemical Vapor Deposition", Materials Letters, vol. 26, Mar. 1996, pp. 223-226.
Yamane et al., "Preparation of GaN Single Crystals Using a Na Flux", Chemical Materials, vol. 9, No. 2, 1997, pp. 413-416.
Yano et al., "Growth of Nitride Crystals, BN, AlN and GaN by Using a Na Flux", Diamond and Related Materials, vol. 9, 2000, pp. 512-515.
Zeisel et al., "DX-Behavior of Si in AlN", Physical Review B, Condensed Matter and Materials Physics, Third Series, vol. 61, No. 24, 2000, pp. R16283-R16286.
Zhmakin, A I., "Enhancement of Light Extraction from Light Emitting Diodes", Physics Reports, vol. 498, 2011, pp. 189-241.
Zhuang et al., "Seeded Growth of AlN Single Crystals by Physical Vapor Transport", Journal of Crystal Growth, vol. 287, 2006, pp. 372-375.
Examination Report Received for Chinese Patent Application No. 201180032355.3 mailed on Jan. 4, 2015, 12 pages (8 pages of English Translation).
Notification to Pay Further Search Fee Received for European Patent Application No. 06844590.7 mailed on Feb. 6, 2015, 9 pages.
Examination Report Received for European Patent Application No. 06844804.2 mailed on Jan. 30, 2015, 5 pages.
PCT International Application No. PCT/US2011/042571, International Preliminary Report on Patentability mailed on Jan. 17, 2013, 10 pages.

* cited by examiner

PSEUDOMORPHIC ELECTRONIC AND OPTOELECTRONIC DEVICES HAVING PLANAR CONTACTS

RELATED APPLICATION

This application claims the benefit of and priority to U.S. Provisional Patent Application No. 61/788,141, filed Mar. 15, 2013, the entire disclosure of which is hereby incorporated herein by reference.

GOVERNMENT SUPPORT

This invention was made with United States Government support under contract W911NF-09-2-0068 with the United States Army. The United States Government has certain rights in the invention.

TECHNICAL FIELD

In various embodiments, the present invention relates to improving carrier injection efficiency (e.g., the hole injection efficiency) into high-aluminum-content electronic and optoelectronic devices. Embodiments of the present invention also relate to improving ultraviolet optoelectronic devices fabricated on nitride-based substrates, in particular to improving light extraction therefrom.

BACKGROUND

The output powers, efficiencies, and lifetimes of short-wavelength ultraviolet light-emitting diodes (UV LEDs)—i.e., LEDs that emit light at wavelengths less than 350 nm—based on the nitride semiconductor system remain limited due to high defect levels in the active region. These limitations are particularly problematic (and notable) in devices designed to emit at wavelengths less than 280 nm. Particularly in the case of devices formed on foreign substrates, such as sapphire, defect densities remain high despite significant efforts to reduce them. These high defect densities limit both the efficiency and the reliability of devices grown on such substrates.

The recent introduction of low-defect, crystalline aluminum nitride (AlN) substrates has the potential to dramatically improve nitride-based optoelectronic semiconductor devices, particularly those having high aluminum concentration, due to the benefits of having lower defects in the active regions of these devices. For example, UV LEDs pseudomorphically grown on AlN substrates have been demonstrated to have higher efficiencies, higher power, and longer lifetimes compared to similar devices formed on other substrates. Generally, these pseudomorphic UV LEDs are mounted for packaging in a "flip-chip" configuration, where the light generated in the active region of the device is emitted through the AlN substrate, while the LED dies have their front surfaces (i.e., the top surfaces of the devices during epitaxial growth and initial device fabrication prior to bonding) bonded to a patterned submount which is used to make electrical and thermal contact to the LED chip. A good submount material is polycrystalline (ceramic) AlN because of the relatively good thermal expansion match with the AlN chip and because of the high thermal conductivity of this material. Due to the high crystalline perfection that is achievable in the active device region of such devices, internal efficiencies greater than 60% have been demonstrated.

Unfortunately, the photon-extraction efficiency is often still very poor in these devices, ranging from about 4% to about 15% achieved using surface-patterning techniques—much lower than exhibited by many visible-light (or "visible") LEDs. Thus, the current generation of short-wavelength UV LEDs has low wall-plug efficiencies (WPEs) of, at best, only a few percent, where the WPE is defined as the ratio of usable optical power (in this case, emitted UV light) achieved from the diode to the electrical power supplied into the device. The WPE of an LED may be calculated by taking the product of the electrical efficiency ($\eta_{el}$), the photon extraction efficiency ($\eta_{ex}$), and the internal efficiency (IE); i.e., WPE=$\eta_{el} \times \eta_{ex} \times$IE. The IE itself is the product of current injection efficiency ($\eta_{inj}$) and the internal quantum efficiency (IQE); i.e., IE=$\eta_{inj} \times$IQE. Thus, a low $\eta_{ex}$ will deleteriously impact the WPE even after the IE has been improved via the reduction of internal crystalline defects enabled by, e.g., the use of the AlN substrates referenced above as platforms for the devices.

There are several possible contributors to low photon-extraction efficiency. For example, currently available AlN substrates generally have some absorption in the UV wavelength range, even at wavelengths longer than the band edge in AlN (which is approximately 210 nm). This absorption tends to result in some of the UV light generated in the active area of the device being absorbed in the substrate, hence diminishing the amount of light emitted from the substrate surface. However, this loss mechanism may be mitigated by thinning the AlN as described in U.S. Pat. No. 8,080,833 ("the '833 patent," the entire disclosure of which is incorporated by reference herein) and/or by reducing the absorption in the AlN substrate as described in U.S. Pat. No. 8,012,257 (the entire disclosure of which is incorporated by reference herein). Additionally, UV LEDs typically suffer because approximately 50% of the generated photons are directed toward the p-contact, which typically includes photon-absorbing p-GaN. Even when photons are directed toward the AlN surface, only about 9.4% typically escape from an untreated surface due to the large index of refraction of the AlN, which results in a small escape cone. These losses are multiplicative and the average photon extraction efficiency may be quite low.

As demonstrated in a recent publication by Grandusky et al. (James R. Grandusky et al., 2013 Appl. Phys. Express, Vol. 6, No. 3, 032101, hereinafter referred to as "Grandusky 2013," the entire disclosure of which is incorporated by reference herein), it is possible to increase the photon extraction efficiency to approximately 15% in pseudomorphic UV LEDs grown on AlN substrates via the attachment of an inorganic (and typically rigid) lens directly to the LED die via a thin layer of an encapsulant (e.g., an organic, UV-resistant encapsulant compound). This encapsulation approach, which is also detailed in U.S. patent application Ser. No. 13/553,093, filed on Jul. 19, 2012 ("the '093 application," the entire disclosure of which is incorporated by reference herein), increases the critical angle of total internal reflection through the top surface of the semiconductor die, which significantly improves photon-extraction efficiency for the UV LEDs. In addition, and as mentioned above, the photon extraction efficiency may be increased by thinning the AlN substrate and by roughening the surface of the AlN substrate surface as discussed in the '833 patent.

Unfortunately, none of these efforts addresses the major loss of photons due to absorption in the p-GaN utilized for the p-contact to these devices. In the type of pseudomorphic UV device described by Grandusky 2013, p-GaN is used to make the p-contact to the LED because it allows a relatively low resistance contact to be made to the p-side of the device. However, the band gap energy of GaN is only 3.4 eV, and thus it is highly absorbing to photons with wavelengths shorter than 365 nm. Since typically 50% of the photons generated are directed toward the p-contact, these photons are typically immediately lost due to absorption in the p-GaN. In addition, even photons directed toward the emission surface of the diode will typically only have a single chance to escape since, if they are reflected back into the diode, they will likely be absorbed by the p-GaN. The p-GaN is utilized conventionally because it is very difficult to make a low-resistivity contact to p-$Al_xGa_{1-x}N$ where x is greater than 0.3. In addition, metals that allow low-resistivity contact to the p-type nitride semiconductor material are generally poor reflectors. This reflectivity problem is particularly exacerbated when the desired wavelength of the LED is less than 340 nm since most common metals will start to absorb strongly in that regime.

In addition, prior work has suggested using a thick p-GaN layer (or p-$Al_xGa_{1-x}N$ layer with x<0.2) so that the hole current spreads sufficiently from and beneath the p-metal contacts. This approach generally will not work for devices emitting light of wavelengths shorter than 300 nm because of the high absorption of the p-GaN or p-$Al_xGa_{1-x}N$ material at these shorter wavelengths.

Alternatively, the above-referenced shortcomings might be remedied via the use of a non-absorbing p-type semiconductor on the p-side of the LED and the use of p-contact metallurgy that reflects the UV photons. However, conventional approaches are unsuited to pseudomorphic UV LEDs since these approaches use multiple layers of thin p-$Al_xGa_{1-x}N$ where the p-type $Al_xGa_{1-x}N$ layers are thin enough to be optically transparent to the UV radiation at wavelengths shorter than 300 nm. This type of multi-layer structure is very difficult to grow on a pseudomorphic device structure (where the underlying substrate is either AlN or $Al_xGa_{1-x}N$ with x>0.6), because the large amount of strain (due to the lattice mismatch) typically causes the thin GaN (or low aluminum content $Al_xGa_{1-x}N$) to island and become very rough. In the Grandusky 2013 paper, contact roughening is addressed by making the p-type GaN layer quite thick; however, such layers, as detailed above, absorb UV photons and diminish UV LED device efficiencies.

Therefore, in view of the foregoing, there is a need for improved contact metallurgy and performance for UV LEDs, particularly those UV LEDs produced on AlN substrates, in order to improve characteristics, such as the WPE, of such devices.

SUMMARY

In various embodiments of the present invention, a smooth p-GaN (or p-$Al_xGa_{1-x}N$ layer where x<0.3) layer is produced on the active region (e.g., a pseudomorphic active region) of an electronic or optoelectronic device grown on a single-crystal AlN substrate or single-crystal $Al_xGa_{1-x}N$ substrate where x>0.6. This smooth p-GaN or p-$Al_xGa_{1-x}N$ layer where x<0.3 will hereinafter be abbreviated as the SPG layer. The SPG layer is very desirable for improved fabrication of any pseudomorphic electronic or optoelectronic device utilizing a p-contact because it minimizes or substantially eliminates the rough surfaces that are difficult to etch and metallize uniformly. In various embodiments of the present invention, the SPG layer may also be made sufficiently thin to be transparent to UV radiation having wavelengths shorter than 340 nm. The thin, UV-transparent SPG layer may be combined with a reflective metal contact to the SPG layer, and this bilayer structure may then be used to both efficiently inject holes into a UV optoelectronic device and reflect UV photons from the p-contact. In various embodiments of the present invention, the thin, UV-transparent SPG layer, when combined with an appropriately designed UV reflective contact, will allow a pseudomorphic UV LED to be fabricated on an AlN (or $Al_xGa_{1-x}N$ substrate with x>0.6) substrate with a photon extraction efficiency greater than 25%. The thin SPG layer on a pseudomorphic UV LED may be combined with a reflector metal contact to achieve a WPE greater than 10% at wavelengths shorter than 275 nm at current densities exceeding 30 $A/cm^{-2}$.

In further embodiments of the present invention, a first metal layer capable of making a low-resistivity contact to the SPG layer is disposed on the SPG layer and patterned. The resulting gaps in the first metal layer may then be filled via the deposition of a second metal layer that is an efficient reflector of UV photons. In this manner, the two-metal structure provides the dual advantages of low contact resistance and high reflectivity, both of which improve the performance of UV LEDs.

In an exemplary embodiment, Al may be used as the reflector metal, as it has >90% reflectivity to light having a wavelength of approximately 265 nm. However, Al is quite poor for making a low-resistivity contact to p-type GaN or p-type $Al_xGa_{1-x}N$ because of its low work function (4.26 eV). The high resistivity of the Al/nitride interface is addressed by the regions of the low-resistivity contact metal; however, in order to prevent absorption of the UV photons by the contact metal, preferred embodiments of the invention utilize only limited contact areas between the contact metal and the underlying semiconductor rather than a contact metal-semiconductor contact area covering substantially all of the semiconductor surface. For example, in some embodiments (i) more than about 10% of the semiconductor surface is covered by the contact metal, but (ii) less than about 70%, less than about 60%, less than about 50%, or even less than 40% of the semiconductor surface is covered by the contact metal, while the remaining portion of the semiconductor surface is covered by the reflector metal to minimize deleterious absorption of the UV light.

In one aspect, embodiments of the invention feature a method of forming a contact to a UV light-emitting device. A substrate having an $Al_yGa_{1-y}N$ top surface is provided, where y≥0.4 (and ≤1.0). The substrate may be substantially entirely composed of the $Al_yGa_{1-y}N$ material (e.g., AlN), or the substrate may include or consist essentially of a different material (e.g., silicon carbide, silicon, and/or sapphire) with the $Al_yGa_{1-y}N$ material formed thereover by e.g., epitaxial growth; such material may be substantially fully lattice relaxed and may have a thickness of, e.g., at least 1 μm. An active, light-emitting device structure is formed over the substrate, the device structure including or consisting essentially of a plurality of layers each including or consisting essentially of $Al_xGa_{1-x}N$. An undoped graded $Al_{1-z}Ga_zN$ layer is formed over the device structure, a composition of the graded layer being graded in Ga concentration z such that the Ga concentration z increases in a direction away from the light-emitting device structure. (For example, the Ga concentration z may increase from a composition of approximately 0.15 proximate the device structure to a composition of approximately 1 at the top of the graded layer.) A p-doped $Al_{1-w}Ga_wN$ cap layer is formed over the graded layer, the cap layer (i) having a thickness between approximately 2 nm and approximately 30 nm, (ii) a surface roughness of less than approximately 6 nm over a sample size of approximately 200 μm×300 μm, and (iii) a Ga concentration w≥0.8. A metallic contact comprising at least one metal is formed over the $Al_{1-w}Ga_wN$ cap layer, the metallic contact having a contact resistivity to the $Al_{1-w}Ga_wN$ cap layer of less than approximately 1.0 mΩ-$cm^2$.

Embodiments of the invention may include one or more of the following in any of a variety of combinations. Forming the $Al_{1-w}Ga_wN$ cap layer may include or consist essentially of epitaxial growth at a temperature between 850° C. and 900° C. and a growth pressure less than 50 Torr, e.g., between approximately 10 Torr and approximately 30 Torr, for example 20 Torr. The $Al_{1-w}Ga_wN$ cap layer may be doped with Mg and/or may be at least partially relaxed. The light-emitting device may have a photon extraction efficiency of greater than 25%. The graded layer and $Al_{1-w}Ga_wN$ cap layer may collectively absorb less than 80% of UV photons generated by the light-emitting device structure and having a wavelength less than 340 nm. The at least one metal of the metallic contact may include or consist essentially of Ni/Au and/or Pd. The metallic contact may have a reflectivity to light generated by the light-emitting device structure of approximately 60% or less, or even approximately 30% or less. The metallic contact may be formed as a plurality of discrete lines and/or pixels of the at least one metal, portions of the $Al_{1-w}Ga_wN$ cap layer not being covered by the metallic contact. A reflector may be formed over the metallic contact and the uncovered portions of the $Al_{1-w}Ga_wN$ cap layer. The reflector may include or consist essentially of a metal having greater than 60%, or even greater than 90%, reflectivity to UV light and a work function less than approximately 4.5 eV. The reflector may have a contact resistivity to the $Al_{1-w}Ga_wN$ cap layer of greater than approximately 5 m$\Omega$-cm$^2$, or even greater than approximately 10 m$\Omega$-cm$^2$. The reflector may include or consist essentially of Al.

The light-emitting device may include or consist essentially of a light-emitting diode or a laser. A bottom portion of the graded layer proximate the active device structure may have a Ga concentration z substantially equal to a Ga concentration of a layer directly thereunder, and/or a top portion of the graded layer opposite the bottom portion of the graded layer may have a Ga concentration z of approximately 1. Forming the $Al_{1-w}Ga_wN$ cap layer may include or consist essentially of epitaxial growth at a growth rate between 0.5 nm/min and 5 nm/min. Between forming the graded layer and forming the $Al_{1-w}Ga_wN$ cap layer, a surface of the graded layer may be exposed to a precursor of the p-type dopant of the cap layer without exposure to a Ga precursor. The p-type dopant of the cap layer may include or consist essentially of Mg. The substrate may consist essentially of doped or undoped AlN.

In another aspect, embodiments of the invention feature a UV light-emitting device including or consisting essentially of a substrate having an $Al_yGa_{1-y}N$ top surface, where y≤0.4 (and ≤1.0), a light-emitting device structure disposed over the substrate, the device structure including or consisting essentially of a plurality of layers each including or consisting essentially of $Al_xGa_{1-x}N$, an undoped graded $Al_{1-z}Ga_zN$ layer disposed over the device structure, a composition of the graded layer being graded in Ga concentration z such that the Ga concentration z increases in a direction away from the light-emitting device structure, a p-doped $Al_{1-w}Ga_wN$ cap layer disposed over the graded layer, the p-doped $Al_{1-w}Ga_wN$ cap layer (i) having a thickness between approximately 2 nm and approximately 30 nm, (ii) a surface roughness of less than approximately 6 nm over a sample size of approximately 200 μm×300 μm, and (iii) a Ga concentration w≥0.8, and a metallic contact disposed over the $Al_{1-w}Ga_wN$ cap layer and including or consisting essentially of at least one metal, the metallic contact having a contact resistivity to the $Al_{1-w}Ga_wN$ cap layer of less than approximately 1.0 m$\Omega$-cm$^2$. The substrate may be substantially entirely composed of the $Al_yGa_{1-y}N$ material (e.g., AlN), or the substrate may include or consist essentially of a different material (e.g., silicon carbide, silicon, and/or sapphire) with the $Al_yGa_{1-y}N$ material formed thereover by e.g., epitaxial growth; such material may be substantially fully lattice relaxed and may have a thickness of, e.g., at least 1 μm.

Embodiments of the invention may include one or more of the following in any of a variety of combinations. The $Al_{1-w}Ga_wN$ cap layer may be doped with Mg and/or may be at least partially relaxed. The light-emitting device may have a photon extraction efficiency of greater than 25%. The graded layer and $Al_{1-w}Ga_wN$ cap layer may collectively absorb less than 80% of UV photons generated by the light-emitting device structure and having a wavelength less than 340 nm. The at least one metal of the metallic contact may include or consist essentially of Ni/Au and/or Pd. The metallic contact may have a reflectivity to light generated by the light-emitting device structure of approximately 60% or less, or even approximately 30% or less.

The metallic contact may have the form of a plurality of discrete lines and/or pixels of the at least one metal, portions of the $Al_{1-w}Ga_wN$ cap layer not being covered by the metallic contact. A reflector may be disposed over the metallic contact and the uncovered portions of the $Al_{1-w}Ga_wN$ cap layer. The reflector may include or consist essentially of a metal having greater than 60%, or even greater than 90%, reflectivity to UV light and a work function less than approximately 4.5 eV. The reflector may have a contact resistivity to the $Al_{1-w}Ga_wN$ cap layer of greater than approximately 5 m$\Omega$-cm$^2$, or even greater than approximately 10 m$\Omega$-cm$^2$. The reflector may include or consist essentially of Al. The light-emitting device may include or consist essentially of a light-emitting diode or a laser. A bottom portion of the graded layer proximate the active device structure may have a Ga concentration z substantially equal to a Ga concentration of a layer directly thereunder, and/or a top portion of the graded layer opposite the bottom portion of the graded layer may have a Ga concentration z of approximately 1. The substrate may consist essentially of doped or undoped AlN.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means ±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
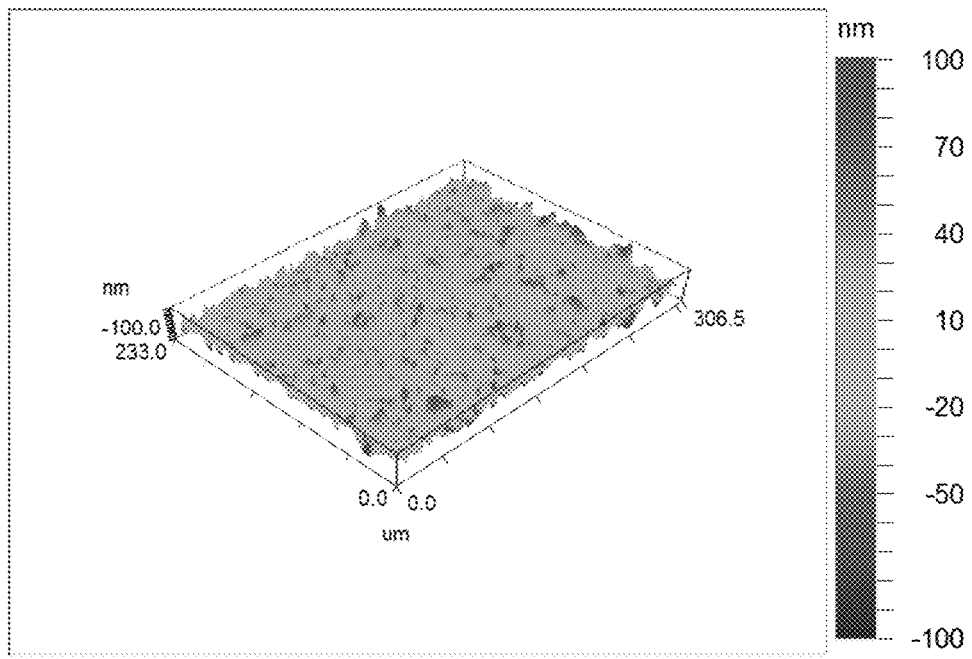
FIG. 1 is an optical profilometry surface-roughness scan of a conventional contact layer for an LED device.
Figure 2:
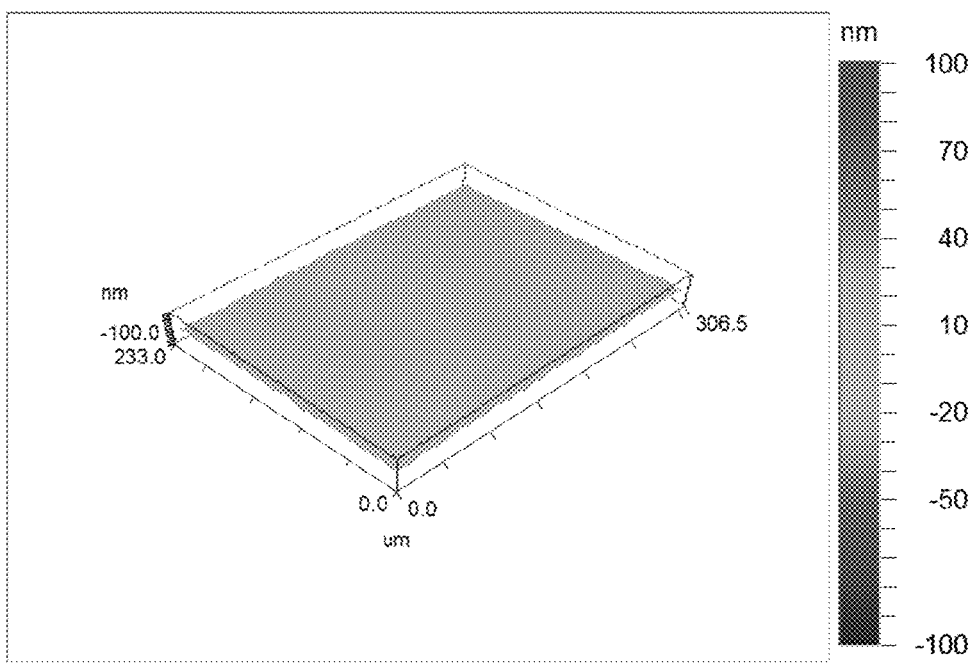
FIG. 2 is an optical profilometry surface-roughness scan of a contact layer for a light-emitting device in accordance with various embodiments of the invention.

Embodiments of the invention include pseudomorphic $Al_xGa_{1-x}N$ electronic and light-emitting devices on a substrate having an $Al_yGa_{1-y}N$ top surface, where $y \geq 0.4$ (and $\leq 1.0$). The substrate may be substantially entirely composed of the $Al_yGa_{1-y}N$ material (e.g., AlN), or the substrate may include or consist essentially of a different material (e.g., silicon carbide, silicon, and/or sapphire) with the $Al_yGa_{1-y}N$ material formed thereover by e.g., epitaxial growth; such material may be substantially fully lattice relaxed and may have a thickness of, e.g., at least 1 µm. (Although light-emitting devices in accordance with preferred embodiments of the present invention are configured for the emission of UV light, the substrate need not be transparent to UV radiation (e.g., silicon), since it may be partially or substantially removed during device fabrication.) The devices according to embodiments of the invention also have a thin p-GaN or p-$Al_xGa_{1-x}N$ contact layer that is smooth (i.e., having a root-mean-square (Rq) surface roughness of less than approximately 6 nm, or even less than approximately 1 nm). The roughness may characterized with optical profilometry over a sample size of approximately 200 µm×300 µm, e.g., 233 µm×306.5 µm. FIG. 1 depicts a profilometry scan of a conventional rough contact-layer surface having an Rq value of approximately 33 nm. In contrast, FIG. 2 depicts a smooth contact surface in accordance with embodiments of the present invention that has an Rq value of only approximately 6 nm.

In preferred embodiments of the invention, the threading dislocation density (TDD) in the active region of the device is less than $10^5$ cm$^{-2}$. Furthermore, in preferred embodiments, the thin p-GaN or p-$Al_xGa_{1-x}N$ (SPG) final layer will be sufficiently thin to allow light with wavelengths shorter than 340 nm to be transmitted with minimal absorption (i.e., absorption in a single pass no greater than 80%, no greater than 50%, or even no greater than 40%). By decreasing the thickness of the SPG layer or by increasing the concentration of Al in a given thickness for the SPG layer, the UV absorption at wavelengths shorter than 340 nm may be decreased to 50%, to 25%, to 10%, or even to 5% or less. For example, for a UV LED designed to operate at 265 nm, the absorption coefficient of this radiation in the p-GaN layer will be approximately $1.8 \times 10^5$ cm$^{-1}$. Table 1 illustrates various thickness-absorption relationships for $Al_xGa_{1-x}N$ layers of various Al contents x and thicknesses for a variety of emission wavelengths. In Table 1, absorption values are shown for layers of 40% Al only for emission wavelengths up to 265 nm, as such layers become substantially transparent at larger wavelengths.

TABLE 1

| Al % in AlGaN | Emission wave-length (nm) | % absorbed (single pass) thickness (microns) | | | | | | | |
|---|---|---|---|---|---|---|---|---|---|
| | | 0.001 | 0.002 | 0.003 | 0.01 | 0.025 | 0.05 | 0.1 | 0.2 |
| 0 | 235 | 2.5% | 4.9% | 7.2% | 22.1% | 46.5% | 71.3% | 91.8% | 99.3% |
| 0 | 250 | 2.1% | 4.1% | 6.1% | 18.9% | 40.8% | 65.0% | 87.8% | 98.5% |
| 0 | 265 | 1.7% | 3.4% | 5.1% | 16.1% | 35.4% | 58.3% | 82.6% | 97.0% |
| 0 | 280 | 1.6% | 3.1% | 4.7% | 14.8% | 33.0% | 55.1% | 79.8% | 95.9% |
| 0 | 305 | 1.3% | 2.6% | 3.8% | 12.2% | 27.7% | 47.8% | 72.7% | 92.6% |
| 20 | 235 | 1.8% | 3.6% | 5.4% | 16.9% | 37.0% | 60.3% | 84.3% | 97.5% |
| 20 | 250 | 1.6% | 3.1% | 4.7% | 14.8% | 33.0% | 55.1% | 79.8% | 95.9% |
| 20 | 265 | 1.3% | 2.7% | 4.0% | 12.6% | 28.6% | 49.1% | 74.1% | 93.3% |
| 20 | 280 | 1.2% | 2.4% | 3.5% | 11.3% | 25.9% | 45.1% | 69.9% | 90.9% |
| 20 | 305 | 0.9% | 1.8% | 2.7% | 8.6% | 20.1% | 36.2% | 59.3% | 83.5% |
| 40 | 235 | 1.4% | 2.8% | 4.1% | 13.1% | 29.5% | 50.3% | 75.3% | 93.9% |
| 40 | 250 | 1.2% | 2.4% | 3.5% | 11.3% | 25.9% | 45.1% | 69.9% | 90.9% |
| 40 | 265 | 1.0% | 2.0% | 3.0% | 9.5% | 22.1% | 39.3% | 63.2% | 86.5% |

In order to improve the photon extraction efficiency and enable extraction of photons directed towards the p-type material, a UV reflector may be introduced into the device structure to reflect transmitted photons and direct them towards the AlN substrate so that they may be extracted from the device. In visible LEDs, this is often accomplished by using a silver p-contact, as silver both forms an ohmic contact to visible-LED structures and is reflective to visible photons. In addition, the layers that form a visible LED are generally transparent to the photons being generated in the quantum wells. However, the reflectivity of silver drops rapidly in the UV range. The reflectivities of most other common metals also drop as the wavelength decreases into the UV range with the exception of Al, which unfortunately does not form a good ohmic contact to p-type GaN or $Al_xGa_{1-x}N$.

Thus, in order to reflect photons while still achieving good ohmic contact, a fairly non-reflective (at least to UV photons) contact metallurgy (e.g., Ni/Au or Pd) may be formed over the contact layer but patterned to reduce the surface "footprint" of the contact over the semiconductor. In this manner, the surface area over the device layers that is non-reflective to UV photons is minimized, yet good ohmic contact to the semiconductor is still achieved. In order to reflect at least a portion of the UV photons, a reflective metal such as Al may be provided directly over the semiconductor between the non-reflective contact regions. The reflective metal makes an ohmic contact with the non-reflective metal, enabling electrical contact to the LED while utilizing the superior metal-semiconductor contact formed by the non-reflective metal.

In such embodiments, the SPG layer may include or consist essentially of a p-GaN or p-$Al_xGa_{1-x}N$ layer where x<0.3. Typically, thicker SPG layers may be utilized as the Ga content is decreased, as the lattice-mismatch strain (that may roughen the SPG layer) between the SPG layer and the underlying AlN substrate decreases. However, the Ga content of the SPG layer is preferably maintained at or above 70% in order to enable a highly doped, low-resistivity layer.

For p-type $Al_xGa_{1-x}N$ layers doped with Mg, as the Al mole fraction (x) is increased, the activation energy of the Mg impurity is increased. This leads to lower activation of the Mg, resulting in lower hole concentration as the Al mole fraction is increased. One solution to this is to utilize polarization-induced doping, which may be achieved by the grading of an $Al_xGa_{1-x}N$ layer from high x to lower x as it is deposited. This may be used to achieve hole concentrations much higher than may be achieved through conventional impurity doping. In addition, this technique may result in improved carrier mobilities due to lack of impurity scattering and reduced temperature dependence of the hole concentration. High hole concentrations may be achieved in the absence of impurity doping or in addition to impurity doping. Preferred embodiments of the invention feature low dislocation density in pseudomorphic graded layers, which enables high hole concentration in the absence of impurity doping, thus allowing for higher conductivity and improved current spreading from thin transparent layers. These high hole concentrations make it possible to achieve p-contacts with low resistivity. In particular, resistivities less than 10 $m\Omega\text{-}cm^2$ may be achieved in accordance with embodiments of the present invention. In preferred embodiments, resistivities less than 5 $m\Omega\text{-}cm^2$ are achieved and utilized in UV LEDs. For contacts with resistivities of 10 $m\Omega\text{-}cm^2$, the device may be operated at 30 $A/cm^2$ with a 1:3 ratio of contact metal to reflector metal (as detailed above) and achieve a voltage drop across the p-contact of less than 1.2 V with a device area of 0.0033 $cm^2$. By covering 75% of the p-contact area with good reflector metal and using an SPG layer with absorption less than 80%, it is possible to achieve photon extraction efficiencies in UV LEDs that are greater than 25%, particularly when combined with the efficient photon extraction techniques described above. When the high photon extraction efficiency of greater than 25% is combined with the low-resistivity contact described above, embodiments of the invention exhibit wall plug efficiencies greater than 10% at an operating current density exceeding 30 $A/cm^2$.

Figure 3A:
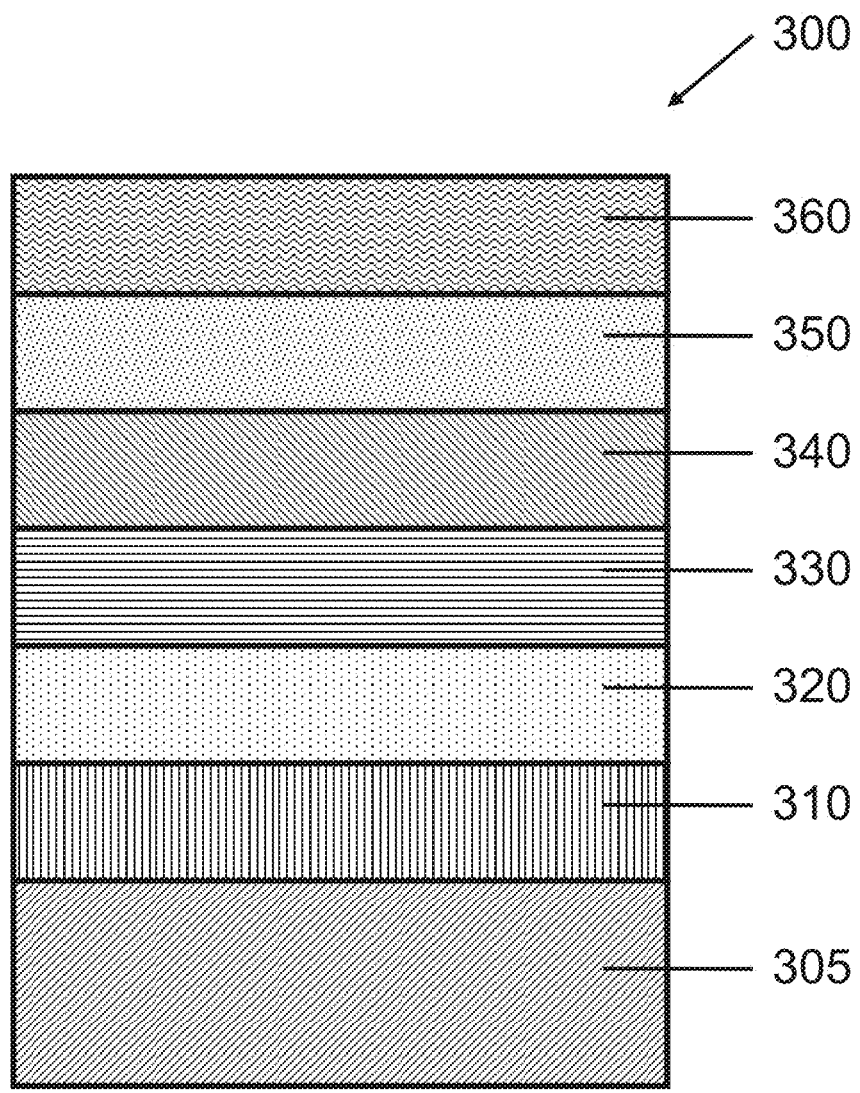
FIG. 3A and 3B are schematic cross-sections of light-emitting devices in accordance with various embodiments of the invention.

FIG. 3A depicts a pseudomorphic UV light emitting diode ("PUVLED") structure 300 in accordance with embodiments of the present invention. A semiconductor substrate 305, which includes or consists essentially of, e.g., a substrate having an $Al_yGa_{1-y}N$ top surface, where y≥0.4 (and ≤1.0), is provided. The substrate may be substantially entirely composed of the $Al_yGa_{1-y}N$ material (e.g., AlN), or the substrate may include or consist essentially of a different material (e.g., silicon carbide, silicon, and/or sapphire) with the $Al_yGa_{1-y}N$ material formed thereover by e.g., epitaxial growth; such material may be substantially fully lattice relaxed and may have a thickness of, e.g., at least 1 µm. As mentioned above, the substrate 305 need not be transparent to UV radiation (e.g., silicon), since it may be partially or substantially removed during device fabrication. Semiconductor substrate 305 may be miscut such that the angle between its c-axis and its surface normal is between approximately 0° and approximately 4°. In a preferred embodiment, the misorientation of the surface of semiconductor substrate 305 is less than approximately 0.3°, e.g., for semiconductor substrates 305 that are not deliberately or controllably miscut. In other embodiments, the misorientation of the surface of semiconductor substrate 305 is greater than approximately 0.3°, e.g., for semiconductor substrates 305 that are deliberately and controllably miscut. In a preferred embodiment, the direction of the miscut is towards the a-axis. The surface of semiconductor substrate 305 may have a group-III (e.g., Al-) polarity or N-polarity, and may be planarized, e.g., by chemical-mechanical polishing. The RMS surface roughness of semiconductor substrate is preferably less than approximately 0.5 nm for a 10 µm×10 µm area. In some embodiments, atomic-level steps are detectable on the surface when probed with an atomic-force microscope. The threading dislocation density of semiconductor substrate 305 may be measured using, e.g., etch pit density measurements after a 5 minute KOH—NaOH eutectic etch at 450° C. Preferably the threading dislocation density is less than approximately $2\times10^3$ $cm^{-2}$. In some embodiments substrate 305 has an even lower threading dislocation density. Semiconductor substrate 305 may be topped with a homoepitaxial layer (not shown) that includes or consists essentially of the same semiconductor material present in semiconductor substrate 300, e.g., Al.

In an embodiment, an optional graded buffer layer 310 is formed on semiconductor substrate 305. Graded buffer layer 310 may include or consist essentially of one or more semiconductor materials, e.g., $Al_xGa_{1-x}N$. In a preferred embodiment, graded buffer layer 310 has a composition approximately equal to that of semiconductor substrate 305 at an interface therewith in order to promote two-dimensional growth and avoid deleterious islanding (such islanding may result in undesired elastic strain relief and/or surface roughening in graded buffer layer 310 and subsequently grown layers). The composition of graded buffer layer 310 at an interface with subsequently grown layers (described below) is generally chosen to be close to (e.g., approximately equal to) that of the desired active region of the device (e.g., the $Al_xGa_{1-x}N$ concentration that will result in the desired wavelength emission from the PUVLED). In an embodiment, graded buffer layer 310 includes $Al_xGa_{1-x}N$ graded from an Al concentration x of approximately 100% to an Al concentration x of approximately 60%.

A bottom contact layer 320 is subsequently formed above substrate 305 and optional graded layer 310, and may include or consist essentially of $Al_xGa_{1-x}N$ doped with at least one impurity, e.g., Si. In an embodiment, the Al concentration x in bottom contact layer 320 is approximately equal to the final Al concentration x in graded layer 310 (i.e., approximately equal to that of the desired active region (described below) of the device). Bottom contact layer 320 may have a thickness sufficient to prevent current crowding after device fabrication (as described below) and/or to stop on during etching to fabricate contacts. For example, the thickness of bottom contact layer 320 may be less than approximately 200 nm. When utilizing a bottom contact layer 320 of such thickness, the final PUVLED may be fabricated with back-side contacts. In many embodiments, bottom contact layer 320 will have high electrical conductivity even with a small thickness due to the low defect density maintained when the layer is pseudomorphic. As utilized herein, a pseudomorphic film is one where the strain parallel to the interface is approximately that needed to distort the lattice in the film to match that of the substrate. Thus, the parallel strain in a pseudomorphic film will be nearly or approximately equal to the difference in lattice parameters between an unstrained substrate parallel to the interface and an unstrained epitaxial layer parallel to the interface.

A multiple-quantum well ("MQW") layer 330 is fabricated above bottom contact layer 320. MQW layer 330 corresponds to the "active region" of PUVLED structure 300 and includes a plurality of quantum wells, each of which may include or consist essentially of AlGaN. In an embodiment, each period of MQW layer 330 includes an $Al_xGa_{1-x}N$ quantum well and an $Al_yGa_{1-y}N$ barrier, where x is different from y. In a preferred embodiment, the difference between x and y is large enough to obtain good confinement of the electrons and holes in the active region, thus enabling high ratio of radiative recombination to non-radiative recombination. In an embodiment, the difference between x and y is approximately 0.05, e.g., x is approximately 0.35 and y is approximately 0.4. However, if the difference between x and y is too large, e.g., greater than approximately 0.3, deleterious islanding may occur during formation of MQW layer 330. MQW layer 330 may include a plurality of such periods, and may have a total thickness less than approximately 50 nm. Above MQW layer 330 may be formed an optional thin electron-blocking (or hole-blocking if the n-type contact is put on top of the device) layer 340, which includes or consists essentially of, e.g., $Al_xGa_{1-x}N$, which may be doped with one or more impurities such as Mg. Electron-blocking layer 340 has a thickness that may range between, e.g., approximately 10 nm and approximately 50 nm. A top contact layer 350 is formed above electron blocking layer 340, and includes or consists essentially of one or more semiconductor materials, e.g., $Al_xGa_{1-x}N$, doped with at least one impurity such as Mg. Top contact layer 350 is doped either n-type or p-type, but with conductivity opposite that of bottom contact layer 310. The thickness of top contact layer 350 is, e.g., between approximately 50 nm and approximately 100 nm. Top contact layer 350 is capped with a cap layer 360, which includes or consists essentially of one or more semiconductor materials doped with the same conductivity as top contact layer 350. In an embodiment, cap layer 360 includes GaN doped with Mg, and has a thickness between approximately 10 nm and approximately 200 nm, preferably approximately 50 nm. In some embodiments, high-quality ohmic contacts may be made directly to top contact layer 350 and cap layer 360 is omitted. In other embodiments, top contact layer 350 and/or electron-blocking layer 340 are omitted and the top contact is formed directly on cap layer 360 (in such embodiments, cap layer 360 may be considered to be a "top contact layer"). While it is preferred that layers 310-340 are all pseudomorphic, top contact layer 350 and/or cap layer 360 may relax without introducing deleterious defects into the active layers below which would adversely affect the performance of PUVLED structure 300 (as described below with reference to FIG. 3B). Each of layers 310-350 is pseudomorphic, and each layer individually may have a thickness greater than its predicted critical thickness. Moreover, the collective layer structure including layers 310-350 may have a total thickness greater than the predicted critical thickness for the layers considered collectively (i.e., for a multiple-layer structure, the entire structure has a predicted critical thickness even when each individual layer would be less than a predicted critical thickness thereof considered in isolation).

Figure 3B:
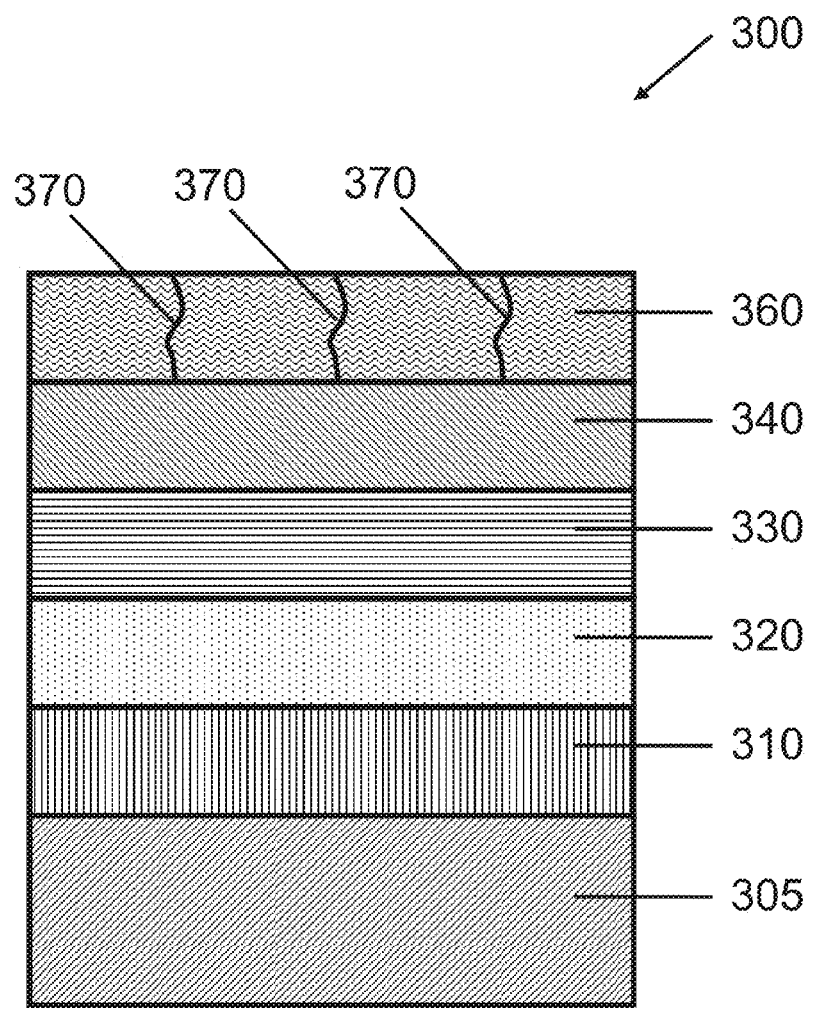

In various embodiments, layers 310-340 of PUVLED structure 300 are pseudomorphic, and cap layer 360 is intentionally relaxed. As shown in FIG. 3B, layers 310-340 are formed as described above with reference to FIG. 3A. Cap layer 360 is subsequently formed in a partially or substantially strain-relaxed state via judicious selection of its composition and/or the deposition conditions. For example, the lattice mismatch between cap layer 360 and substrate 305 and/or MQW layer 330 may be greater than approximately 1%, greater than approximately 2%, or even greater than approximately 3%. In a preferred embodiment, cap layer 360 includes or consists essentially of undoped or doped GaN, substrate 305 includes or consists essentially of AlN, and MQW layer 330 includes or consists essentially of multiple $Al_{0.55}Ga_{0.45}N$ quantum wells interleaved with $Al_{0.75}Ga_{0.25}N$ barrier layers, and cap layer 360 is lattice mismatched by approximately 2.4%. Cap layer 360 may be substantially relaxed, i.e., may have a lattice parameter approximately equal to its theoretical unstrained lattice constant. As shown, a partially or substantially relaxed cap layer 360 may contain strain-relieving dislocations 370 having segments threading to the surface of cap layer 360 (such dislocations may be termed "threading dislocations"). The threading dislocation density of a relaxed cap layer 360 may be larger than that of substrate 305 and/or layers 310-340 by, e.g., one, two, or three orders of magnitude, or even larger. Cap layer 360 is preferably not formed as a series of coalesced or uncoalesced islands, as such islanding may deleteriously impact the surface roughness of cap layer 360.

A graded layer may be formed between layers 310-340 and cap layer 360, and its composition at its interfaces with layers 340, 360 may substantially match the compositions of those layers. The thickness of this graded layer, which is preferably pseudomorphically strained, may range between approximately 10 nm and approximately 50 nm, e.g., approximately 30 nm. In some embodiments, epitaxial growth may be temporarily stopped between growth of the graded layer and cap layer 360.

In an exemplary embodiment, an electron-blocking layer 340 including or consisting essentially of $Al_{0.8}Ga_{0.2}N$ or $Al_{0.85}Ga_{0.15}N$ is formed over MQW layer 330. Prior to formation of cap layer 360 including or consisting essentially of GaN, a graded layer is formed over electron-blocking layer 340. The graded layer may be graded in composition from, for example, $Al_{0.85}Ga_{0.15}N$ to GaN over a thickness of approximately 30 nm. The graded layer may be formed by, e.g., MOCVD, and in this embodiment is formed by ramping the flow of TMA and TMG (by ramping the flow of hydrogen through their respective bubblers) from the conditions utilized to form electron-blocking layer 340 to 0 standard cubic centimeters per minute (sccm) and 6.4 sccm, respectively, over a period of approximately 24 minutes, thus resulting in a monotonic grade from $Al_{0.85}Ga_{0.15}N$ to GaN (all of the other growth conditions are substantially fixed). The thickness of the graded layer in this exemplary embodiment is approximately 30 nm, and a hole concentration of approximately $3 \times 10^{19}$ $cm^{-3}$ may be achieved through polarization doping without impurity doping (e.g., even being substantially free of doping impurities), as modeled using SiLENSe software. In general, polarization doping is enabled by the polarization in nitride materials that is due to the difference in electronegativity between the metal atoms and the nitrogen atoms. This results in a polarization field along asymmetric directions in the wurtzite crystal structure. In addition, strain in the layers may result in additional piezoelectric polarization fields and thus additional polarization doping. These fields create fixed charges at abrupt interfaces (e.g., two-dimensional sheets) or graded composition layers (e.g., three-dimensional volumes), which results in mobile carriers of the opposite sign. The magnitude of the total charge is defined by the difference in Al compositions within the graded layer, i.e., the difference between the starting composition and the final composition. The concentration of carriers is defined by the total charge divided by the graded layer thickness. A very high carrier concentration may be achieved by a high composition change over a small thickness, while a lower composition change or larger grading thickness typically results in a smaller carrier concentration; however, for a given composition change the total number of carriers is generally constant.

Figure 4A:
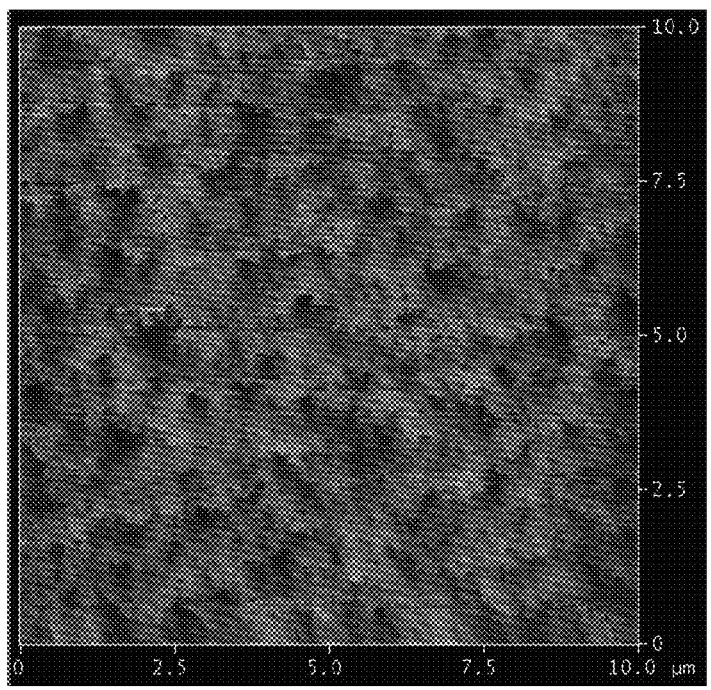
FIG. 4A is an atomic force microscopy scan of a capping layer for a light-emitting device in accordance with various embodiments of the invention.
Figure 4B:
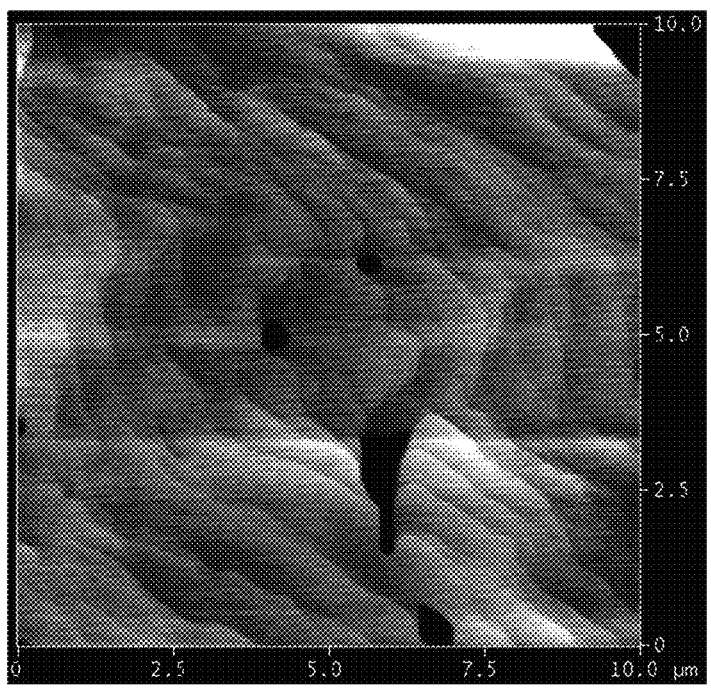
FIG. 4B is an atomic force microscopy scan of a conventional capping layer for a light-emitting device.

As detailed above, preferred embodiments of the present invention utilize very thin SPG layers in order to minimize absorption of UV photons therein. Such SPG layers preferably have thicknesses of less than 50 nm, e.g., between approximately 10 nm and approximately 30 nm. In an embodiment, smooth (25-50 nm) p-GaN layers were grown on a typical pseudomorphic LED structure (AlN/n-AlGaN/MQW/electron-blocking layer/p-GaN) by MOCVD and trimethylgallium (TMGa) and $NH_3$ were used as Ga and N precursors. Some conventional p-GaN layers are grown at 1000° C. and at a pressure of 100 Torr, and often these layers are rough, exhibiting an islanded or pyramidal morphology. Such approaches are encouraged by the conventional wisdom in the art, which indicates that one should enhance the mobility of the Ga adatom to promote lateral growth and coalescence of the layer. Thus, conventional wisdom teaches that contact-layer growth should use increased V/III ratios and higher temperatures. However, such techniques were unable to achieve smooth surfaces on the pseudomorphic layer in the thickness range utilized in embodiments of the present invention. Notably, the large strain in the pseudomorphic layer enhances island formation and increased surface roughness. Unexpectedly, in order to suppress such surface roughening, in accordance with embodiments of the present invention, growth temperatures of 850° C.-900° C. may be utilized for growth of the SPG layer, and growth pressures of 20 Torr may be utilized to enhance the adatom mobility at this lower growth-temperature regime. The growth rate of smooth p-GaN is only approximately 5 nm/min. The morphological and elemental properties of resulting SPG layers were investigated using atomic force microscopy (AFM) and secondary ion mass spectroscopy (SIMS). AFM shows smoother p-GaN layers (Rq value of approximately 0.85 nm) as shown in FIG. 4A, compared to the rougher morphology of conventional p-GaN (Rq value of approximately 7.2 nm) shown in FIG. 4B. Here, the actual island heights are over 50 nm and these thicker islands result in higher absorption and also leave areas uncovered by p-GaN which will result in poor p-contact by the contact metallization when these holes occur in the regions that are covered by the contact metallization. SIMS analysis shows higher doping concentration (by a factor of two) in the smooth p-GaN compared to the conventional p-GaN; however, the concentration is not constant and does not reach equilibrium until growth of ~25 nm of p-GaN, resulting in difficulties making ohmic contacts to layers thinner than 25 nm. In order to overcome this issue, a soak, i.e., exposure within the deposition chamber, (of, e.g., 1-10 minutes, for example 5 minutes) with only the dopant (e.g., Mg) source (i.e., no Ga source) flowing may be utilized to saturate the surface prior to growth initiation. For example, bis-cyclopentadienylmagnesium (Cp2Mg) may be utilized at an Mg source for the soak when MOCVD is being utilized for layer growth. The precursor may be disposed within a bubbler, and a carrier gas such as nitrogen or hydrogen may be flowed into the bubbler to form a gas solution saturated with the dopant precursor. This enables higher dopant concentration and good ohmic contact formation to layers as thin as 5 nm. In summary, very thin p-GaN layers (<10 nm) may be easily realized in this growth regime owing to the slower growth rate and the conformal morphology while the doping concentrations may be optimized by adjusting the input precursor flows.

Figure 5:
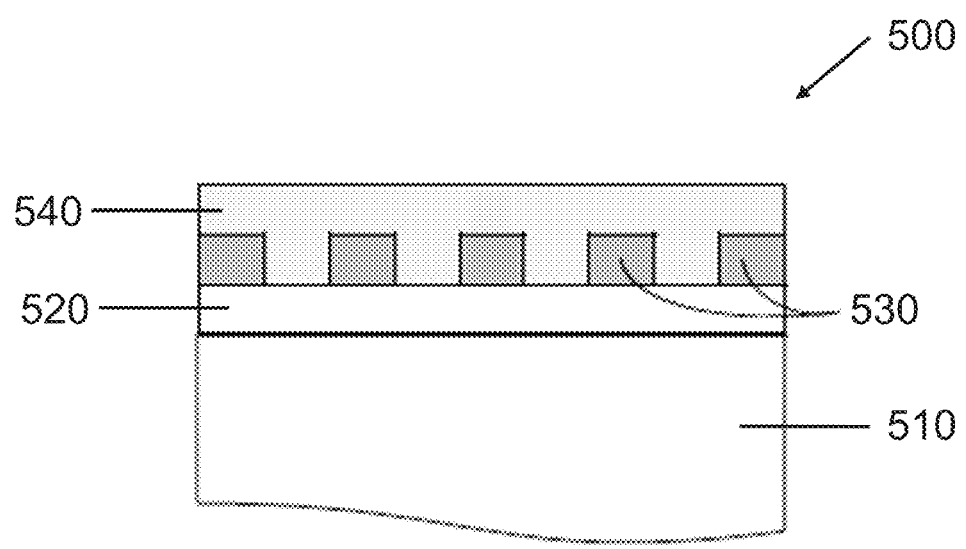
FIG. 5 is a schematic cross-section of a portion of a light-emitting device in accordance with various embodiments of the invention.

In an exemplary embodiment, polarization doping and a thin SPG layer are combined with a patterned reflector as shown in FIG. 5, which depicts a portion of a UV LED device 500. In device 500, region 510 includes or consists essentially of the AlN substrate and the active region of the device, for example as detailed above and illustrated in FIG. 3A. Region 510 is topped with a SPG layer 520, which is kept smooth to enable a very thin layer with high UV transparency. A contact layer 530, formed on the SPG layer 520, is typically substantially not UV reflective but forms a good ohmic contact to the SPG layer 520. In an exemplary embodiment, contact layer 530 includes or consists essentially of Ni/Au. As shown, the contact layer is, in preferred embodiments, patterned onto the surface of SPG layer 520. The spacing between individual portions of contact layer 530 may be defined via, e.g., conventional photolithography. The pattern may be in the form of lines or patterns of isolated "pixels" (or "islands") as shown in FIG. 5. Lines may have widths of, for example, 1 μm to 50 μm, e.g., 5 μm, and may have spacings therebetween of, for example 1 μm to 50 μm, e.g., 5 μm. Pixels may be, for example, substantially cubic or rectangular solids or may even be substantially hemispherical, and pixels may have a dimension such as width, length, or diameter of, for example, 1 μm to 50 μm, e.g., 5 μm. The contact area and the spacing are typically defined to optimize the wall plug efficiency of the device.

As shown in FIG. 5, the contact layer 530 may be capped with a reflector 540 formed both above the contact layer 530 (or isolated portions thereof) and between portions of the contact layer 530 (i.e., in direct contact with SPG layer 520). The reflector 540 typically includes or consists essentially of a metal (or metal alloy) that is highly reflective to UV light but that does not form a good ohmic contact to the SPG layer 520. For example, the reflector 540 may include or consist essentially of Al. The contact area of the contact layer 530 will generally determine, at least in part, the effective contact resistance of the combined contact layer 530 and reflector 540. For instance, if 10% of the area is covered by the contact layer 530, then the effective contact resistance is increased by a factor of ten. However, at the same time, the reflector area (i.e., the area of SPG layer 520 capped directly by reflector 540, without contact layer 530 therebetween) is increased. In an exemplary embodiment, the contact resistivity of the contact layer 530 is less than approximately 1.0 mΩ-cm$^2$, or even less than approximately 0.5 mΩ-cm$^2$. By using a 1:10 ratio of contact 530 area to reflector 540 area, the effective contact resistance is increased to 5 mΩ and the effective (averaged over all area) reflector is reduced by 10% (e.g., a 90% reflectivity of the reflector 540 is effectively reduced to 81%). In addition, the size of individual metal contact pixels of contact layer 530 is preferably kept as small as possible so that current spreading from the individual contact pixels occurs. This increases the probability that the generated photons will strike the reflector 540 rather than the contact pixel of contact layer 530 (which would typically occur if the current traveled straight down from the contact metal pixel of contact layer 530). The polarization-doped AlGaN enables current spreading while maintaining transparency even with a thin SPG layer 520; the thin SPG layer 520 is used primarily to lower the contact resistance while maintaining low absorption. This is in direct contrast to conventional methods where p-doping in high Al content $Al_xGa_{1-x}N$ is highly resistive and will not allow current spreading.

Embodiments of the invention may utilize photon-extraction techniques described in the '093 application. Such techniques include surface treatment (e.g., roughening, texturing, and/or patterning), substrate thinning, substrate removal, and/ or the use of rigid lenses with thin intermediate encapsulant layers. Exemplary substrate-removal techniques include laser lift-off, as described in "High brightness LEDs for general lighting applications using the new Thin GaN™—Technology", V. Haerle, et al., Phys. Stat. Sol. (a) 201, 2736 (2004), the entire disclosure of which is incorporated by reference herein.

In embodiments in which the device substrate is thinned or removed, the back surface of the substrate may be ground, for example, with a 600 to 1800 grit wheel. The removal rate of this step may be purposefully maintained at a low level (approximately 0.3-0.4 µm/s) in order to avoid damaging the substrate or the device layers thereover. After the optional grinding step, the back surface may be polished with a polishing slurry, e.g., a solution of equal parts of distilled water and a commercial colloidal suspension of silica in a buffered solution of KOH and water. The removal rate of this step may vary between approximately 10 µm/min and approximately 15 µm/min. The substrate may be thinned down to a thickness of approximately 200 µm to approximately 250 µm, or even to a thickness of approximately 20 µm to approximately 50 µm, although the scope of the invention is not limited by this range. In other embodiments, the substrate is thinned to approximately 20 µm or less, or even substantially completely removed. The thinning step is preferably followed by wafer cleaning in, e.g., one or more organic solvents. In one embodiment of the invention, the cleaning step includes immersion of the substrate in boiling acetone for approximately 10 minutes, followed by immersion in boiling methanol for approximately 10 minutes.

Structures fabricated utilizing the above-described techniques in accordance with various embodiments of the present invention have been fabricated with three different reflector metal areas, 0%, 51%, and 60%. No significant forward voltage increase was observed at 51% reflector metal area with only 0.1 V increase at 100 mA (while a 0.4 V increase was seen at 60% reflector metal area), and an improvement in extraction efficiency of 24% was measured for devices emitting through a thick absorbing AlN substrate with 51% reflector metal area. However, when combined with die thinning, roughening, and encapsulation an overall gain of ~100% was achieved for devices with 51% reflector metal area compared to devices with 0% reflector area. The results from 60% reflector area were improved less than 51%, but optimization of both contact metal spacing and reflector area may result in further gains in overall efficiency.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:
1. An ultraviolet (UV) light-emitting device comprising:
   a substrate having an $Al_yGa_{1-y}N$ top surface, wherein $y \geq 0.4$;
   a light-emitting device structure disposed over the substrate, the device structure comprising a plurality of layers each comprising $Al_xGa_{1-x}N$;
   an undoped graded $Al_{1-z}Ga_zN$ layer disposed over the device structure, a composition of the graded layer being graded in Ga concentration z such that the Ga concentration z increases in a direction away from the light-emitting device structure;
   a p-doped $Al_{1-w}Ga_wN$ cap layer disposed over the graded layer, the p-doped $Al_{1-w}Ga_wN$ cap layer having (i) a thickness between approximately 2 nm and approximately 30 nm, (ii) a surface roughness of less than approximately 6 nm over a sample size of approximately 200 µm×300 µm, and (iii) a Ga concentration $w \geq 0.8$; and
   a metallic contact disposed over the $Al_{1-w}Ga_wN$ cap layer and comprising at least one metal, the metallic contact having a contact resistivity to the $Al_{1-w}Ga_wN$ cap layer of less than approximately 1.0 mΩ-cm$^2$.

2. The light-emitting device of claim 1, wherein the $Al_{1-w}Ga_wN$ cap layer is doped with Mg.

3. The light-emitting device of claim 1, wherein the $Al_{1-w}Ga_wN$ cap layer is at least partially relaxed.

4. The light-emitting device of claim 1, wherein the light-emitting device has a photon extraction efficiency of greater than 25%.

5. The light-emitting device of claim 1, wherein the graded layer and $Al_{1-w}Ga_wN$ cap layer collectively absorb less than 80% of UV photons generated by the light-emitting device structure and having a wavelength less than 340 nm.

6. The light-emitting device of claim 1, wherein the at least one metal of the metallic contact comprises Ni/Au or Pd.

7. The light-emitting device of claim 1, wherein the metallic contact has a reflectivity to light generated by the light-emitting device structure of approximately 60% or less.

8. The light-emitting device of claim 1, wherein the metallic contact has a reflectivity to light generated by the light-emitting device structure of approximately 30% or less.

9. The light-emitting device of claim 1, wherein the metallic contact has the form of a plurality of discrete lines and/or pixels of the at least one metal, portions of the $Al_{1-w}Ga_wN$ cap layer not being covered by the metallic contact.

10. The light-emitting device of claim 9, further comprising a reflector disposed over the metallic contact and the uncovered portions of the $Al_{1-w}Ga_wN$ cap layer.

11. The light-emitting device of claim 10, wherein the reflector comprises a metal having greater than 90% reflectivity to UV light and a work function less than approximately 4.5 eV.

12. The light-emitting device of claim 10, wherein the reflector has a contact resistivity to the $Al_{1-w}Ga_wN$ cap layer of greater than approximately 5 mΩ-cm$^2$.

13. The light-emitting device of claim 10, wherein the reflector has a contact resistivity to the $Al_{1-w}Ga_wN$ cap layer of greater than approximately 10 mΩ-cm$^2$.

14. The light-emitting device of claim 10, wherein the reflector comprises Al.

15. The light-emitting device of claim 1, wherein the light-emitting device comprises a light-emitting diode.

16. The light-emitting device of claim 1, wherein (i) a bottom portion of the graded layer proximate the active device structure has a Ga concentration z substantially equal to a Ga concentration of a layer directly thereunder and (ii) a top portion of the graded layer opposite the bottom portion of the graded layer has a Ga concentration z of approximately 1.

17. The light-emitting device of claim 1, wherein the substrate consists essentially of doped or undoped AlN.

* * * * *